(12) United States Patent
Zeng et al.

(10) Patent No.: US 10,522,736 B2
(45) Date of Patent: Dec. 31, 2019

(54) METHOD OF MANUFACTURE FOR POLYMER FOAM-BASED PIEZOELECTRIC MATERIAL

(71) Applicant: The Florida State University Research Foundation, Inc., Tallahassee, FL (US)

(72) Inventors: Changchun Zeng, Tallahassee, FL (US); Yan Li, Tallahassee, FL (US)

(73) Assignee: The Florida State University Research Foundation, Inc., Tallahassee, FL (US)

(*) Notice: Subject to any disclaimer, the term of this patent is extended or adjusted under 35 U.S.C. 154(b) by 305 days.

(21) Appl. No.: 15/337,660

(22) Filed: Oct. 28, 2016

(65) Prior Publication Data

US 2017/0047505 A1    Feb. 16, 2017

Related U.S. Application Data

(60) Division of application No. 14/827,596, filed on Aug. 17, 2015, now Pat. No. 9,490,420, which is a continuation of application No. PCT/US2014/016717, filed on Feb. 17, 2014.

(60) Provisional application No. 61/765,536, filed on Feb. 15, 2013, provisional application No. 61/765,989, filed on Feb. 18, 2013.

(51) Int. Cl.
| | | |
|---|---|---|
| *H04R 17/00* | (2006.01) | |
| *H01L 41/277* | (2013.01) | |
| *H01L 41/193* | (2006.01) | |
| *H01L 41/08* | (2006.01) | |
| *H01L 41/083* | (2006.01) | |
| *H01L 41/39* | (2013.01) | |
| *H01L 41/45* | (2013.01) | |

(52) U.S. Cl.
CPC .......... *H01L 41/277* (2013.01); *H01L 41/08* (2013.01); *H01L 41/083* (2013.01); *H01L 41/193* (2013.01); *H01L 41/39* (2013.01); *H01L 41/45* (2013.01)

(58) Field of Classification Search
CPC ..... H01L 41/08; H01L 41/083; H01L 41/277; H01L 41/39; H01L 41/193; H01L 41/045; H01G 4/20; H04R 17/005
USPC ........................................ 310/311; 29/25.35
See application file for complete search history.

(56) References Cited

U.S. PATENT DOCUMENTS

| | | | |
|---|---|---|---|
| 8,446,080 B2 * | 5/2013 | Jenninger | B06B 1/06 310/311 |
| 2010/0181871 A1 | 7/2010 | Jurgen, II et al. | |
| 2011/0109200 A1 | 5/2011 | Jenninger et al. | |
| 2011/0234056 A1 | 9/2011 | Jenninger et al. | |

(Continued)

OTHER PUBLICATIONS

Yang, Y., Zeng, C. And Lee, L. (2004), Three-Dimensional Assembly of Polymer Microstructures at Low Temperatures. Adv. Mater., 16: 560-564. doi:10.1002/adma.200306159.*

(Continued)

*Primary Examiner* — Paul D Kim
(74) *Attorney, Agent, or Firm* — Eversheds Sutherland (US) LLP

(57) ABSTRACT

Thermally stable piezoelectric polymer foams (ferroelectrets) with high piezoelectric activity for sensing and actuation. The invention further includes a method of fabricating such foams in an environmentally friendly manner.

12 Claims, 19 Drawing Sheets

(56) References Cited

U.S. PATENT DOCUMENTS

| | | | |
|---|---|---|---|
| 2011/0309716 A1* | 12/2011 | Jenninger | B32B 3/30 310/300 |
| 2014/0009039 A1* | 1/2014 | Jenninger | B32B 3/20 310/367 |
| 2014/0312737 A1 | 10/2014 | Jenninger et al. | |

OTHER PUBLICATIONS

Hu, Z.; von Seggern, H.: Breakdown-induced polarization buildup in porous fluoropolymer sandwiches: a thermally stable piezoelectret. Journal of Applied Physics 2006, 99, 024102-5.

Zhukov, S.; von Seggern, H.: Polarization hysteresis and piezoelectricity in open-porous fluoropolymer sandwiches. Journal of Applied Physics 2007, 102, 044109-6.

Altafim, R. A. C.; Basso, H. C.; Altafim, R. A. P.; Lima, L.; de Aquino, C. V.; Neto, L. G.; Gerhard-Multhaupt, R.: Piezoelectrets from thermo-formed bubble structures of fluoropolymer-electret films. Dielectrics and Electrical Insulation, IEEE Transactions on 2006, 13, 979-985.

Zhang X.; Hillenbrand, J.; Sessler, G. M.: Thermally stable fluorocarbon ferroelectrets with high piezoelectric coefficient. Applied Physics A: Materials Science & Processing 2006, 84, 139-142.

Zhang X.; Hillenbrand, J.; Sessler, G. M.: Ferroelectrets with improved thermal stability made from fused fluorocarbon layers. Journal of Applied Physics 2007, 101, 054114-8.

Zhang X.; Huang, J.; Xia, Z.: Piezoelectric activity and thermal stability of cellular fluorocarbon films. Physica Scripta 2007, 274.

Mellinger, A.; Wegener, M.; Wirges, W.; Gerhard-Multhaupt, R.: Thermally stable dynamic piezoelectricity in sandwich films of porous and nonporous amorphous fluoropolymer. Applied Physics Letters 2001, 79, 1852-1854.

Voronina, O.; Wegener, M.; Wirges, W.; Gerhard, R.; Zirkel, L.; Münstedt, H.: Physical foaming of fluorinated ethylene-propylene (FEP) copolymers in supercritical carbon dioxide: single-film fluoropolymer piezoelectrets. Applied Physics A: Materials Science & Processing 2008, 90, 615-618.

Evreinov G.; Raisamo, R.: One-directional position-sensitive force transducer based on EMFi. Sensors and Actuators A: Physical 2005, 123-124, 204-209.

Qiu X, Patterned piezo-, pyro-, and ferroelectricity of poled polymer electrets. Journal of Applied physics 2010, 108, 011101-19.

S. A. Wilson, R. P. J. Jourdain, Q. Zhang, R. A. Dorey, C. R. Bowen, M. Willander, Q. U. Wahab, M. Willander, M. A. H. Safaa, O. Nur, E. Quandt, C. Johansson, E. Pagounis, M. Kohl, J. Matovic, B. Samel, W. van der Wijngaart, E. W. H. Jager, D. Carlsson, Z. Djinovic, M. Wegener, C. Moldovan, R. Iosub, E. Abad, M. Wendlandt, C. Rusu, K. Persson, New materials for micro-scale sensors and actuators an engineering review. Mater. Sci. Eng. R2007, 56, 1.

Wirges W, Wegener M, Voronina O, Zirkel L, Gerhard-Multhaupt R, Optimized preparation of elastically soft, highly piezoelectric cellular ferroelectrets from nonvoided poly(ethylene terephthalate) films. Advanced Functional Materials 2007, 17, 324-329.

Wegener M, Wirges W, Gerhard-Multhaupt R, Piezoelectric polyethylene terephthalate (PETP) foams-specifically designed and prepared ferroelectret films. Advanced Engineering Materials 2005, 7, 1128-1131.

Tuncer E, Wegener M, Elastic properties of highly anisotropic thin poly(propylene) foams. Materials Letters 2004, 58, 2815-2818.

Yang G M, Sessler G M, Hatke W, Electret properties of cycloolefincopolymer-polypropylene blends. IEEE Internat. Symp. Electret, Delphi, Greece, pp. 317-320, 1999.

Sessler G M, Yang G M, Hatke W, in 1997 Annual Report, Conference on Electrical Insulation and Dielectric Phenomena, IEEE 1997, 467-470.

Wegener M, Paajanen M, Voronina O, Schulze R, Wirges W, Gerhard-Multhaupt, Voided cyclo-olefin polymer films: ferroelectrets with high thermal stability. in: Proceedings 12th International Symposium on Electrets (ISE 12), IEEE Service Center, Piscataway, NJ, (2005), p. 47-50.

Savijärvi A-M, Paajanen M, Saarimäki E, Minkkinen H, Novel heat durable electromechanical films: cellular film making from cyclic olefin polymers. in: Proceedings 12th International Symposium on Electrets (ISE 12), IEEE Service Center, Piscataway, NJ, (2005), p. 75-78.

Saarimäki E, paajanen M, Savijärvi Ann-Mari, Minkkinen H, Wegener M, Voronina O, Schulze R, Wirges W, Gerhard-Multhaupt R, Novel heat durable electromechanical film: processing for electromechanical and electrets applications-IEEE Transactions on Dielectrics and Electrical Insulation 2006, 13, 963-972.

Saarimäki E, Paajanen M, Savijärvi A-M, Minkkinen H, Novel heat durable electromechanical film processing: Preparations for electromechanical and electret applications, in: IEEE 12th Intern. Sympos. Electrets (ISE 12), p. 220-223 2005.

X. Qiu, L. Holländer, R. F. Suárez, W. Wirges, R. Gerhard,: Polarization from dielectric-barrier discharges in ferroelectrets: Mapping of the Electric-field Profiles by Menas of thermal-Pulse Tomography. Appl. Phys. Lett. 2010, 97, 072905.

N. Behrendt,: Tailored Processing Methods for Cellular Polycarbonate and Polytherimide Films—New potentials for Electret and Piezoelectric Applications. IEEE Trans. Dielectr. Electr. Insul. 2010, 17, 1113.

Z. Sun, X. Zhang, Z. Xia, X. Qiu, W. Wirges, R. Gerhard, C. Zeng, C. Zhang, B. Wang,: Polarization and Piezoelectncity in Polymer Films with Artificial Void Structure. Appl. Phys. A 2011, 105, 197.

G. Cao, X. Zhang, D. Zhao, C. Zhang, B. Wang, C. Zeng,: Charge Storage and Transport in Oriented and Non-Oriented Polytetrafluoroethylene Films. IEEE Trans. Dielectr. Electr. Insul. 2012, 19, 1108.

D. R. Falconi, R. A. C. Altafim, R. A. P. Altafim, H. C. Basso,: Multi-layers Fluoroethylenepropylene (FEP) films pounded with adhesive tape to create piezoelectrets with controlled cavities. 2011 Annual Report, CEIDP, IEEE 2011, p. 137.

R. A. P. Altafim, X. Qiu, W. Wirges, R. Gerhard, R. A. C. Altafim, H. C. Basso, W. Jenninger, J. Wagner,: Template-based fluoroethylenepropylene piezoelectrets with tubular channels for transducer applications. J. Appl. Phys. 2009, 106, 014106.

R. A. P. Altafim, X. Qiu, W. Wirges, R. A. C. Altafim, H. C. Basso, R. Gerhard, D. L. Chinaglia, W. Jenninger,: Template-based fluoropolymer ferroelectrets with multiple layers of tubular channels J. Wagner, in 2010 Annual Report, CEIDP, IEEE 2010, p. 1.

R. A. P. Altafim, R. A. C. Altafim, H. C. Basso, X. Qiu, W. Wirges, R. Gerhard,: Fluoroethylenepropylene ferroelectrets with superimposed multi-layer tubular void channels. 2011 Annual Report, CEIDP, IEEE 2011, p. 133.

R. A. P. Altafim, D. Rychkov, W. Wirges, R. Gerhard, H. C. Basso, R. A. C. Altafim,: Laminated Tubular-channel Ferroelectret Systems from Low-density Polyethylene Films and from Fluoroethylenepropylene Copolymer Films—A Comparison. IEEE Trans. Dielectr. Electr. Insul. 2012, 19, 1116.

X. Zhang, J. Huang, J. Chen, Z. Wan, S. Wang, Z. Xia,: Piezoelectric properties of irradiation-crosslinked polypropylene ferroelectrets. Appl. Phys. Lett. 2007, 91, 182901.

X. Zhang, G. Cao, Z. Sun, Z. Xia,: Fabrication of fluoropolymer piezoelectrets by using rigid template: Structure and thermal stability J. Appl. Phys. 2010, 108, 064113.

Z. Chen, C. Zeng, C. Zhang, B. Wang, K. Cao, Z. Yao,: Preparation and Properties of Cyclic Olefin Copolymers Multiwalled Carbon Nanotube Nanocomposites. J. Appl. Polym. Sci. 2012, 126, 1121.

M. Liu, H. Lin, M. Yang, M. Lai, C. Chang, M. Feng, P. Shiao, I. Chen,: Thermal oxidation and molding feasibility of cycloolefin copolymers (COCs) with high glass transition temperature. Polym. Degrad. Stab. 2006, 91, 1443.

T. Yang, S. Lin, T. Chuang,: Kinetic analysis of the thermal oxidation of metallocene cyclic olefin copolymer (mCOC)/ $TiO_2$ composites by FTIR microscopy and thermogravimetry (TG). Polym. Degrad. Stab. 2002, 78, 525.

D. B. Kline, R. P. Wool,: Polymer Welding Relations Investigated by a Lap Shear Joint Method. Polym. Eng. Sci. 1988, 28, 52.

I. Sanchez, R. Lacombe,: An Elementary Molecular Theory of Classical Fluids. Pure Fluids. J. Phys. Chem. 1976, 80, 2352.

(56) References Cited

OTHER PUBLICATIONS

I. Sanchez, R. Lacombe,: Statistical Thermodynamics of Polymer Solutions. Macromolecules 1978, 11, 1145.
P. Condo, I. Sanchez, C. Panayiotou, K. Johnston,: Glass Transition Behavior Including Retrograde Vitrification of Polymers with Compressed Fluid Diluentst Macromolecules 1992, 25, 6119.
R. A. L. Jones,: Glasses with liquid-like surfaces. Nat. Mater. 2003, 2, 645.
Y- Yang, C. Zeng, L. J. Lee,: Three-Dimensional Assembly of Polymer Microstructures at Low Temperatures. Adv. Mater. 2004, 16, 560.
Y. Yang, D. Liu, Y. Xie, L. J. Lee, D. L. Tomasko,: Low-Temperature Fusion of Polymeric Nanostructures Using Carbon Dioxide. Adv. Mater. 2007, 19, 251.
Y. Yang, Y. Xie, X. Kang, L. J. Lee, D. A. Kniss,: Assembly of Three-Dimensional Polymeric Constructs Containing Cells/Biomolecules Using Carbon Dioxide J. Am. Chem. Soc. 2006, 128, 14040.
G. M. Sessler, J. Hillenbrand,: Electromechanical response of cellular electret films. Appl. Phys. Lett. 1999, 75, 3405.
S. P. Timoshenko, S. Woinowsky-Krieger, Theory of Plates and Shells, McGraw-Hill, New York 1959.
K. Bhaskar, B. Kaushik,: Analysis of clamped unsymmetric cross-ply rectangular plates by superposition of simple exact double Fourier series solutions Compos. Struct. 2005, 68, 303.
Peng Fang. 'Preparation and investigation of polymer-foam films and polymer-layering systems for ferroelectrets.' Oct. 14, 2010, pp. 1-140 (http://opus.kobv.de/ubp/volltexte/2010/4841/).
International Search Report for international application No. PCT/US2014/016717, dated Dec. 22, 2014.
Bauer, S.; Gerhard-Multhaupt, R.; Sessler, G. M: Ferroelectrets: Soft Electroactive Foams for Transducers. Physics Today 2004, 57, 37-43.
Gerhard-Multhaupt, R.: Less can be more. Holes in polymers lead to a new paradigm of piezoelectric materials for electret transducers. Dielectrics and Electrical Insulation, IEEE Transactions on 2002, 9, 850-859.
Bauer, S: Piezo-, pyro- and ferroelectrets: soft transducer materials for electromechanical energy conversion. Dielectrics and Electrical Insulation, IEEE Transactions on 2006, 13, 953-962.
Sessler, G. M.; Hillenbrand, J.: Electromechanical response of cellular electret films. Applied Physics Letters 1999, 75, 3405-3407.
Paajanen, M.; Lekkala, J.; Kirjavainen, K.: ElectroMechanical Film (EMFi)—a new multipurpose electret material. Sensors and Actuators A: Physical 2000, 84, 95-102.
Hillenbrand, J.; Sessler, G. M.: Piezoelectricity in cellular electret films. Dielectrics and Electrical Insulation, IEEE Transactions on 2000, 7, 537-542.
Lindner, M.; Hoislbauer, H.; Schwodiauer, R.; Bauer-Gogonea, S.; Bauer, S.: Charged cellular polymers with "ferroelectretic" behavior. Dielectrics and Electrical Insulation, IEEE Transactions on 2004, 11, 255-263.
Kirjavainen, K: Electromechanical film and procedure for manufacturing same. USPTO, Ed., 1987.
Savolainen, A.; Kirjavainen, K: Electrothermomechanical film. Part I. Design and characteristics. Journal of Macromolecular Science, Chemistry 1989, A26, 583-91.
Backman, J.: Audio applications of electromechanical film (ETMF). Journal of the Audio Engineering Society 1990, 38, 364-371.
P. S. Nunes, P. D. Ohlsson, O. Ordeig, J. P. Kutter,: Cyclic olefin polymers: emerging materials for lab-on-a-chip Applications. Microfluid. Nanofluid. 2010, 9, 145.
Raisanen, L; Pohjanvirta, R.; Unkila, M.; Tuomisto, J.: A new method for the measurement of spontaneous motor activity of laboratory animals. Pharmacology and Toxicology 1992, 70, 230-231.
Heikkinen, L. M.; Panula, H. E.; Lyyra, T.; Olkkonen, H.; Kiviranta, I.; Nevalainen, T.; Helminen, H. J.: Electromechanical film sensor device for dynamic force recording from caninen limbs. Scandinavian Journal of Laboratory Animal Science 1997, 24, 85-92.

D. Rychkov, R. A. P. Altatim, X. Qiu, R. Gerhard,: Treatment with orthophosphoric acid enhances the thermal stability of the piezoelectricity in low-density polyethylene ferroelectrets J. Appl. Phys. 2012, 111, 124105.
Hamalainen, M. K.; Parviainen, J. K.; Jaaskelainen, T.: A novel micromovement actuator manufactured using plastic electromechanical film. Review of Scientific Instruments 1996, 67, 1598-1601.
Siivola J.; Leinonen, K.; Räisänen, L.: ETMF-polymer transducer as a detector of respiration in humans. Medical and Biological Engineering and Computing 1993, 31, 634-635.
Wegener, M.; Bauer, S.: Microstorms in Cellular Polymers: A Route to Soft Piezoelectric Transducer Materials with Engineered Macroscopic Dipoles. ChemPhysChem 2005, 6, 1014-1025.
Streicher, A.; Muller, R.; Peremans, H.; Katenbacher, M.; Lerch, R.: Ferroelectrets: ultrasonic transducer for a biomimetic sonar system. In Ultrasonics Symposium, 2004 IEEE, 2004; vol. 2; pp. 1142-1145 vol. 2.
Wegener, M.; Wirges, W.: Optimized electromechanical properties and applications of cellular polypropylene—a new space-charge electret material. In The Nano-Micro Interface: Bridging the Micro and Nano Worlds; Fecht, H.-J., Matthias, W., Eds.; Wiley-VCH Verlag GmbH & Co. KGaA; pp. 303-317.
Graz, I.; Kaltenbrunner, M.; Keplinger, C.; Schwodiauer, R.; Bauer, S.; Lacour, S. P.; Wagner, S.: Flexible ferroelectret field-effect transistor for large-area sensor skins and microphones. Applied Physics Letters 2006, 89, 073501-3.
Buchberger, G.; Schwodiauer, R.; Bauer, S.: Flexible large area ferroelectret sensors for location sensitive touchpads. Applied Physics Letters 2008, 92, 123511-3.
Savolainen, A.: Biaxially oriented polypropylene blown films. I: Morphological analysis of orientation in the machine direction. Polymer Engineering & Science 1990, 30, 1258-1264.
Wegener, M.; Wirges, W.; Dietrich, J. P.; Gerhard-Multhaupt, R.: Polyethylene terephthalate (PETP) foams as ferroelectrets. In Electrets, 2005. ISE-12. 2005 12th International Symposium on, 2005; pp. 28-30.
Fang, P.; Wegener, M.; Wirges, W.; Gerhard, R.; Zirkel, L.: Cellular polyethylene-naphthalate ferroelectrets: Foaming in supercritical carbon dioxide, structural and electrical preparation, and resulting piezoelectricity. Applied Physics Letters 2007, 90, 192908-3.
Fang, P.; Wirges, W.; Wegener, M.; Zirkel, L.; Gerhard, R.: Cellular polyethylene-naphthalate films for ferroelectret applications: foaming, inflation and stretching, assessment of electromechanically relevant structural features. e-Polymers 2008.
Behrendt, N.; Greiner, C.; Fischer, F.; Frese, T.; Altstadt, V.; Schmidt, H. W.; Giesa, R.; Hillenbrand, J.; Sessler, G. M.: Morphology and electret behaviour of microcellular high glass temperature films. Applied Physics A: Materials Science & Processing 2006, 85, 87-93.
Paajanen, M.; Wegener, M.; Gerhard-Multhaupt, R.: Understanding the role of the gas in the voids during corona charging of cellular electret films—a way to enhance their piezoelectricity. Journal of Physics D: Applied Physics 2001, 34, 2482-2488.
Lindner, M.; Bauer-Gogonea, S.; Bauer, S.; Paajanen, M.; Raukola, J.: Dielectric bander microdischarges: Mechanism for the charging of cellular piezoelectric polymers. Journal of Applied Physics 2002, 91, 5283-5287.
Huang, J.; Zhang, X.; Xia, Z.; Wang, X.: Piezoelectrets from laminated sandwiches of porous polytetrafluoroethylene films and nonporous fluoroethylenepropylene films. Journal of Applied Physics 2008, 103, 084111-6.
Tuncer, E.; Wegener, M.: Elastic properties of highly anisotropic thin poly(propylene) foams. Materials Letters 2004, 68, 2815-2818.
Tuncer, E.: Numerical calculations of effective elastic properties of two cellular structures. Journal of Physics D: Applied Physics 2005, 38, 497-503.
A. Mellinger, M. Wegener, W. Wirges, R. R. Mallepally, R. Gerhard-Multhaupt,: Thermal and Temporal Stability of Ferroelectret Films Made from Cellular Polypropylene/Air Composites. Ferroelectrics 2006, 331, 189.

(56) References Cited

OTHER PUBLICATIONS

Hillenbrand, J.; Zhang, X.; Zhang, Y.; Sessler, G. M.: Pressure-treated cellular polypropylene with large piezoelectric coefficients. Annual Report—Conference on Electrical Insulation and Dielectric Phenomena 2003, 40-43.

Mellinger, A.; Gonzalez, F. C.; Gerhard-Multhaupt, R.: Ultraviolet-induced discharge currents and reduction of the piezoelectric coefficient in cellular polypropylene films. Applied Physics Letters 2003, 82, 254-256.

An, Z.; Zhao, M.; Yao, J.; Zhang, Y.; Xia, Z.: Improved piezoelectric properties of cellular polypropylene ferroelectrets by chemical modification. Applied Physics A: Materials Science & Processing 2009, 95, 801-806.

Savijarvi, A. M.; Paajanen, M.; Saarimaki, E.; Minkkinen, H.: Novel heat durable electromechanical films: cellular film making from cyclic olefin polymers. In Electrets, 2005. ISE-12. 2005 12th International Symposium on, 2005; pp. 75-78.

Saarimaki, E.; Paajanen, M.; Savijarvi, A. M.; Minkkinen, H.; Wegener, M.; Voronina, O.; Schulze, R.; Wirges, W.; Gerhard-Multhaupt, R.: Novel heat durable electromechanical film: processing for electromechanical and electret applications. Dielectrics and Electrical Insulation, IEEE Transactions on 2006, 13, 963-972.

Montanari, G. C.; Fabiani, D.; Ciani, F.; Motori, A.; Paajanen, M.; Gerhard-Multhaupt, R.; Wegener, M.: Charging properties and time-temperature stability of innovative polymeric cellular ferroelectrets. Dielectrics and Electrical Insulation, IEEE Transactions on 2007, 14, 238-248.

Bamji, S. S.; Kao, K. J.; Perlman, M. M.: Polymer electrets corona charged at high temperature. J. Electrost. 1979, 6, 373-9.

Topas COC product overview (2006), http://www.topas.com/products/topas-coc-polymers, accessed: Aug. 2011.

Bauer-Gogonea, S.; Bauer, S.: Polymer electrets for electronics, sensors, and photonics. In Light-Emitting Diodes, Lithium Batteries, and Polymer Devices; Nalwa, H. S., Ed.; Academic Press: San Diego, 2001; pp. 185-231.

J. Neggers, J. P. M. Hoefnagels, M. G. D. Geers,: On the Validity Regime of the Bulge Equations. J. Mater. Res. 2012, 27, 1245.

Xia, Z.; Gerhard-Multhaupt, R.; Kunstler, W.; Wedel, A.; Danz, R.: High surface-charge stability of porous polytetrafluoroethylene electret films at room and elevated temperatures. Journal of Physics D: Applied Physics 1999, 32, L83-L85.

Künstler, W.; Xia, Z.; Weinhold, T.; Pucher, A.; Gerhard-Multhaupt, R: Piezoelectricity of porous polytetrafluoroethylene single- and multiple-film electrets containing high charge densities of both polarities. Applied Physics A: Materials Science & Processing 2000, 70, 5-8.

Neugschwandtner, G. S.; Schwödiauer, R; Bauer-Gogonea, S.; Bauer, S.: Large piezoelectric effects in charged, heterogeneous fluoropolymer electrets. Applied Physics A: Materials Science & Processing 2000, 70, 1-4.

Gerhard-Multhaupt, R.; Zhengfu, X.; Kunstler, W.; Pucher, A.: Preliminary study of multi-layer space-charge electrets with piezoelectric properties from porous and non-porous Teflon films. In Electrets, 1999. ISE 10. Proceedings. 10th International Symposium on, 1999; pp. 273-276.

Gerhard-Multhaupt, R.; Kunstler, W.; Gome, T.; Pucher, A.; Weinhold, T.; Seiss, M.; Zhongfu, X.; Wedel, A.; Danz, R.: Jorous PTFE space-charge electrets for piezoelectric applications. Dielectrics and Electrical Insulation, IEEE Transactions on 2000, 7, 480-488.

Hillenbrand, J.; Xia, Z.; Zhang, X.; Sessler, G. M.: Piezoelectricity of cellular and porous polymer electrets. In Electrets, 2002. ISE 11. Proceedings. 11th International Symposium on, 2002; pp. 46-49.

* cited by examiner $d_{33}$ after annealing at the indicated temperatures for 1 h

METHOD OF MANUFACTURE FOR POLYMER FOAM-BASED PIEZOELECTRIC MATERIAL

CROSS-REFERENCE TO RELATED APPLICATIONS

This application is a divisional of and claims priority to U.S. patent application Ser. No. 14/827,596 filed Aug. 17, 2015, now U.S. Pat. No. 9,490,420, entitled "Polymer Foam-Based Piezoelectric Materials and Method of Manufacture", which is a continuation of and claims priority to International Application PCT/US14/16717 filed Feb. 17, 2014, which claims priority to provisional U.S. Patent Application Ser. No. 61/765,536, entitled "Polymer Foam-Based Piezoelectric Materials and Method of Manufacture," filed on Feb. 15, 2013, and provisional U.S. Patent Application Ser. No. 61/765,989, entitled, "Polymer Foam-Based Piezoelectric Materials and Method of Manufacture," filed on Feb. 18, 2013, which are incorporated herein by reference in their entirety.

FEDERALLY SPONSORED RESEARCH OR DEVELOPMENT

This invention was made with Government support under Grant No. VA118-12-C-0066 awarded by the Department of Veterans Affairs. The government has certain rights in the invention.

BACKGROUND OF THE INVENTION

1. Field of the Invention

This invention relates, generally, to polymer films. More particularly, it relates to thermally stable piezoelectric polymer foams and method of fabrication thereof.

2. Description of the Prior Art

Piezoelectrets or ferroelectrets are space-charged porous polymers with significant piezoelectricity. [1, 6, 7, 93] The cellular voids with charges of opposite signs on the upper and lower walls form macroscopic dipoles. The effective dipole moment varies under mechanical stress, which gives rise to the piezoelectricity. [5, 32, 60] Compared with traditional inorganic piezoelectric materials, polymer ferroelectrets show attractive characteristics such as flexibility, light weight, high piezoelectric coefficient $d_{33}$ and low cost. To date, the most intensively studied ferroelectrets are based on the cellular polypropylene (PP) films, which exhibit high piezoelectric coefficients of several hundred to over one thousand pC/N. However, their low operation temperature (normally lower than 60° C.), which results from the poor charge-storage stability of PP at elevated temperatures, [98] restricts their application. Therefore, various strategies have been explored to improve the thermal stability of the ferroelectrets. For example, Rychkov et al. [99] showed that by orthophosphoric acid treatment the piezoelectric coefficient decay curves of the ferroelectrets (polyethylene based) can be shifted to higher temperatures by 40 K. Nonetheless, the majority of the efforts in this area are development of ferroelectrets from more thermally stable polymers.

The optimization of the voids structure to reduce the elastic stiffness may be one critical factor influencing the piezoelectric properties of polymer ferroelectrets. [62,63] Normally an anisotropic void structure is required by polymer ferroelectrets for higher piezoelectric activity. [64] Two different fabrication techniques were proposed for generating this type of void structure. The most commonly investigated approach is based on the combination of biaxial stretching and high pressure treating techniques. However, this method has primarily been limited to the development of cellular polypropylene (PP) due to the difficulty in the creation of cellular structure. For most polymers, only structures with low porosity and thick compact layers can be prepared. An alternative, macroscopic approach has recently been found. Patterned polymer films were assembled to form void structure by bonding. The most common bonding methods used in ferroelectrets include thermo compression and laser ablation, focused on fluoropolymer systems. Although these bonding methods are easy and fast, their applications are restricted in the design of simple two-layer structure or sandwich structure.

In the design of ferroelectrets, another key factor is charge stability of ferroelectret materials. As an example, although the extensively-studied cellular PP ferroelectrets have exhibited very high piezoelectric coefficient of several hundred pC/N, the operating temperature of PP ferroelectrets is normally lower than 60° C. due to the low charge storage stability of PP at elevated temperature. Over fifteen years ago, it was reported that cyclo-olefin copolymers (COCs) exhibited excellent stability of positive surface charge, superior to any known positively charged polymer. [65,66] This, combined with low water adsorption and good mechanical properties, indicate that COCs are likely the most promising candidates for thermally stable ferroelectret material. However, their high elastic stiffness limits their piezoelectric activity to about 15 pC/N. [63,68] Thus the potential value of COC as a ferroelectret material may be diminished. Up to now, no suitable technique has been available for fabricating COC ferroelectrets. In contrast, the progress made in the fabrication process of other thermally stable ferroelectrets has recently been reported, which mainly focused on fluoropolymers.

Traditionally, the primary materials with reasonably large piezoelectric effects are single-crystalline materials such as ferroelectric relaxors (PMN-PT or PZN-PT) and polycrystalline ceramics such as lead zirconate titanate (PZT). Ferroelectrets are space-charge electrets [1-7] made from polymer foams that show strong piezoelectric activity, resulting from the macroscopic dipoles residing in the pores [1]. Their piezoelectric activities rival those of the best ceramic based materials [1,8]. A comparison of piezoelectric coefficients of several piezoelectric materials as seen in the prior art is presented in Table 1.

TABLE 1

Comparison of piezoelectric coefficients of several piezoelectric materials.

| Piezoelectric material | $d_{33}$ (pC/N) |
|---|---|
| Crystal: Quartz (silicon dioxide) | 2 ($d_{11}$) |
| Ceramic: Lead zirconate titanate (PZT) | 170-600 |
| Ferroelectrics: β-phase polyvinylidene (β-PVDF) | 20 |
| Ferroelectret: optimized cellular polypropylene (PP) | 600 |

Currently the only commercially available ferroelectrets are based on porous polypropylene (PP) [8,9] films which have been applied in various devices, i.e., audio devices [10] as microphones [11], force sensors [12-14] and actuators [15], and respiration detectors [16]. They do not have sufficient thermal and UV stability and thus have limited uses. The low operating temperature (−20° C.~50° C.) limits their usefulness. On the other hand, experimental ferroelectrets based on thermally stable polymers have poor piezoelectric activity largely due to lack of understanding of the processes to produce foams with engineered cellular morphology, and in-depth understanding of the processing—morphology—electro-mechanical response. This status quo has a historical origin that was initiated by physicists whose main interest is exploring the dielectric and piezoelectric properties using existing materials instead of development of new materials systems.

Conventional Fabrication of Ferroelectrets

Several steps are involved in the fabrication of ferroelectrets: generation of initial pores, post modification and charging.

Generation of Initial Pores:

The generation of the initial pore structure is typically done in two distinctive ways. The first approach, which is the current industrial practice of producing PP ferroelectrets [22], is a co-extrusion of a multilayer structure followed by biaxial stretching. The middle layer is a film of PP with micron sized particles. Upon stretching, micro-cracks form near the particle region due to higher stress level, resulting in lens-like anisotropic pores.

Recently, direct foaming using a blowing agent has received considerable attention [23-28]. In this approach, the bulk polymer film is placed in a high pressure chamber and saturated with a blowing agent such as carbon dioxide until equilibrium is reached.

Upon pressure release or temperature increase, the gas oversaturation in the polymer leads to formation and growth of bubbles.

Post-Modification:

Following initial generation of the pores, the cell morphology (cell size and shape, and bulk density) can be further modified by stretching, inflation/expansion and stabilization.

Charging:

Charging of the porous polymers is typically done by corona charging. The mechanism is via dielectric barrier microplasma discharges (microstorms) within the pores. [29,30] When the porous materials are subjected to an electric field higher than a critical threshold, dielectric breakdown takes place in the air gap. The microdischarges generate many tiny microplasma discharges, resulting in a current flow and transfer of charges across the air gap. The charges generated are trapped in surface states and form oriented macroscopic dipoles responsible for the large piezoelectric effect. The current pulses are self-extinguished and nondestructive with negligible impact to the cell morphology.

The cell morphology has profound effect on the electromechanical properties of the ferroelectrets. For better charge storage capability and stability, closed cell foams are preferred, in which the pores (cells) are isolated with each other and are surrounded by complete cell walls. On the other hand, charges are more prone to drift and decay [31] in open cell foams where cell walls are broken or even absent and only ribs and struts are left.

Initial theoretical modeling based on a simplified layered structure [4] predicts $d_{33} \propto \in \sigma f(s_1,s_2)/Y$ where $d_{33}$ is the piezoelectric coefficient (in the film thickness direction and aligned with the electrical field), $\in$ is the dielectric constant of the matrix material, $\sigma$ is the stored electrical charge which is directly proportional to the total available surface area within the pores, $f(s_1,s_2)$ is a function of the total thickness of solid layer ($s_1$) and porous layer ($s_2$) and therefore bulk density of the foams, and Y is the elastic modulus of the foams. Whereas the detailed structure—mechanical property relationship using finite element method [32,33] is only preliminary, a simple theoretical analysis [34] has revealed that the elastic modulus is directly proportional to the cell anisotropy (the ratio of the height to the diameter for lens-like cells) and the square of the density of the foams.

Two closely associated gaps exist that mitigate the advancement of ferroelectret materials, as described below.

Materials gap: The foremost challenge in current ferroelectrets is the lack of materials that possess high piezoelectric activity at elevated temperatures. PP ferroelectrets typically have a service temperature less than 60° C. While $d_{33}$ remains stable over periods of years at room temperature, it decays with time constants of the order of days or minutes at 70° C. and 90° C., respectively [35]. It also has very low UV stability [36]. While chemical modification improved the thermal stability and enhanced piezoelectric activity [37], new materials or film systems with better thermal stability are being actively sought. Several groups of materials have been explored, such as cyclo-olefin copolymers (COC) [38-40], poly(ethylene terephthalate) (PET) [23-25], poly(ethylene naphthalate) (PEN) [26, 27], polycarbonate (PC) [71,72], and polyetherimide (PEI) [72,73]. Ferroelectrets from these materials exhibit higher stabilities than PP but possess lower $d_{33}$ coefficients. High temperature engineering thermoplastics were also investigated [28] and improved charge storage stability was observed. For example, over 95 percent of charge is still retained after 1,400 min at 90° C. for poly(etherimide) (PEI) foams [28]. The foam has low porosity and non-uniform cell size distribution. No piezoelectric coefficient was reported.

COCs are also promising candidate materials for thermally stable ferroelectrets. They show excellent storage stability of positive surface charges (superior to any known positively charged polymer). [65,66] Their potential is further augmented by the low water adsorption, exceptional solvent and environmental stability, low dielectric constant and dielectric losses, and excellent mechanical and thermomechanical properties. [100] However, the progress on COCs ferroelectrets to date has been disappointing. There are only scant studies, achieving $d_{33}$ about 15 pC/N. [38, 39, 67, 70]

The other group of candidate materials is fluoropolymers (poly(tetrafluoroethylene) or PTFE, and its copolymers), which have already been widely used as polymer electrets due to their high temperature stability [41], exceptional chemical resistance, excellent insulating properties and charge storage capacity and stability, low dielectric constants and extremely small dielectric losses [42,43].

Despite their substantially higher thermal stability than PP, their low mechanical properties and severe creep behavior (continuous deformation under constant force) would constrain their use in many cases. Moreover, most fluoropolymer-based ferroelectrets contain large amount of open porosity, which is detrimental to the long-term electromechanical stability due to the potential charge de-trapping along the surface of the fibrils. [31,52]

Due to the intrinsic processing difficulties [44], open porous PTFE films produced by a complex process were used as ferroelectret materials [45-50]. To overcome the difficulty resulting from open porous morphology, layered sandwiched structures (a porous PTFE layer between two fluorinated ethylene-propylene copolymer (FEP) films) were explored. [31, 50-54] A value for $d_{33}$ of ~1500 pC/N has been reported for newly prepared samples [52] (note that this is on the order of the best single crystal relaxor ferroelectric materials), while stacks of multiple nonporous and porous film in alternating sequence [55, 56] lead to even higher $d_{33}\sim2200$ pC/N [56]. Sandwiched structures were also prepared using open porous amorphous Teflon (Teflon AF) with nonporous films. [57] Despite substantial improvements in thermal stability of these materials over PP, their long-term stability remains problematic due to charge de-trapping along the surface of the PTFE fibrils [31], which is accelerated by the matrix relaxation [51]. For charge storage and charge storage stability, closed cell morphology is intrinsically superior and preferred but is technically challenging to generate. This type of work is extremely scarce. Only one reference is available in the open literature for FEP ferroelectrets, in which a small $d_{33}$ value (~50 pC/N) was reported [58].

Knowledge/Technology gap: Many knowledge/technology gaps exist due to the highly interdisciplinary nature of the subject. In the context of basic materials processing research, the key gaps are i) lack of sufficient understanding of the impact of cell morphology and materials structure on the mechanical and electro-mechanical responses, which in turn results from: ii) lack of understanding of the materials and processes to produce the desired morphologies and structures; and iii) lack of development of such understanding by fundamental nonlinear electro-mechanical modeling.

The gaps described above can be primarily attributed to the fact that current practice of process parameter selection for foaming does not take into detailed consideration the material properties and is quite heuristic in nature. Other than the well-established process for making PP ferroelectrets, work on foaming of other polymers for ferroelectric applications is still in its infancy. Consequently current experimental thermally stable ferroelectrets being explored possess limited range of poor cell morphology.

One of the key challenges in developing smart materials for actuation and sensing is obtaining high energy density. Whereas conventional smart materials such as shape memory Nitinol, piezoelectric PZT, and magnetostrictive Terfenol-D have relatively large forces, trade-offs in weight penalties (solenoids, actuator density), heat transfer (Nitinol), and environmental issues (lead in PZT) motivate the need for light-weight alternatives with superior electro-mechanical efficiencies. This is a grand challenge for areas such as active flow control where minute texture changes on an aircraft wing can create dramatic changes in lift-to-drag ratios. Furthermore, position specific sensing and actuation capability of the ferroelectrets by rational architecture design [21,59] allow for distributed flow sensory actuation (collocated control) which is considerably more stable than separate sensor-actuator configurations. Light-weight skins using ferroelectrets are envisioned as a viable alternative to make this a reality. Moreover, many other applications include robotic actuators for legged robotics that require high agility in rescue missions or surveillance. Soft actuators are also more amenable to artificial limbs for grasping objects, precision surgical tools or artificial, self-powered organs that more closely match the modulus of biological tissue.

By addressing the materials and processing aspects in conjunction with fundamental understanding of the materials behavior through modeling, the morphology and properties of the ferroelectrets can be well engineered, leading to revolutionary soft piezoelectric materials with tailored mechanical and electro-mechanical response that can be integrated into microelectronics, energy conversion system, and various sensing and actuation systems.

The combining of two processes is proposed: laser cutting and $CO_2$ bonding technology. By aligning the COC grids in a specific manner (detailed in various embodiments presented herein), large deformation in the thickness direction of COC ferroelectrets can be achieved. COC ferroelectrets with significant piezoelectricity may be prepared by applying foaming technology to achieve better manipulation of cell structure for enhanced electro-mechanical properties. However, in view of the art considered as a whole at the time the present invention was made, it was not obvious to those of ordinary skill how the art could be advanced.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions, or is known to be relevant to an attempt to solve any problem with which this specification is concerned.

BRIEF SUMMARY OF THE INVENTION

The long-standing but heretofore unfulfilled need for multilayer polymer ferroelectrets with high piezoelectric coefficient and thermal stability, and methods for manufacturing these ferroelectrets, is now met by a new, useful, and nonobvious invention.

Various embodiments of the present disclosure may be comprised of multilayer polymer ferroelectrets and methods for producing these ferroelectrets. In various embodiments, a plurality of patterned polymer layers may be fabricated. Each patterned layer may comprise a plurality of cavities separated by supporting structures. A metallized polymer top layer and bottom layer may also be fabricated. The patterned layers and the metallized top and bottom layers may be arranged such that at least one of the patterned layers is positioned between the top and bottom metallized layers to form an assembly. The layers of the assembly may be coupled using a carbon dioxide bonding process to form a bonded assembly. The bonded assembly may then be charged by subjecting the bonded assembly to an energy source.

In yet other embodiments, a first patterned polymer layer and a second patterned polymer layer may be fabricated. Each of the first and second polymer layers may comprise a plurality of cavities separated by support structures. A metallized polymer top layer and a metallized polymer bottom layer may be fabricated, as well as a non-metallized central polymer layer. The layers may be arranged in the order: metallized top layer, first patterned layer, central layer, second patterned layer, and metallized bottom layer to form an assembly. The layers of the assembly may be coupled using a carbon dioxide bonding process to form a bonded assembly. The bonded assembly may then be charged by subjecting the bonded assembly to an energy source.

Still further embodiments, a multilayer polymer ferroelectret may comprise a metallized polymer top layer, a first patterned polymer layer comprising a plurality of cavities separated by supporting structures, a central non-metallized polymer layer, a second patterned polymer layer comprising a plurality of cavities separated by supporting structures, and a metallized bottom layer. The cavities of the second patterned layer may be positioned in a horizontal offset from the cavities of the first patterned layer. Positive electric charges and negative electric charges may be positioned apart from one another across the cavities.

BRIEF DESCRIPTION OF THE DRAWINGS

For a fuller understanding of the nature and objects of the invention, reference should be made to the following detailed disclosure, taken in connection with the accompanying drawings, in which.

DETAILED DESCRIPTION OF THE INVENTION

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

In various embodiments, a supercritical carbon dioxide ($CO_2$)-assisted macroscopic assembly approach was used to fabricate COC ferroelectrets with high thermal stability and significant piezoelectricity, with piezoelectric $d_{33}$ coefficient over 1,000 pC/N. The fabrication takes advantage of the strong COC—$CO_2$ interactions and associated severe depression of both bulk and surface glass transition temperatures. COC ferroelectrets were successfully assembled at 120° C. (60° C. below the glass transition temperature) with excellent structural fidelity and bonding strength (>1.8 MPa by lap shear measurement). Various embodiments thus overcome some challenging issues in fabricating ferroelectrets by fusion bonding that is commonly used for the fabrication of high-temperature ferroelectrets such as fluoropolymers ferroelectrets. [31, 53, 54, 57, 73-81] As the fusion bonding involves partial melting of the patterned structures, structural deformation is a concern. In addition, the high temperature required for bonding (~230-240° C. for COC 6017) presents considerable challenges to process the material while avoiding potential oxidation that is detrimental to the charge-storage stability and increases dielectric losses. [82-84]

Figure 1:
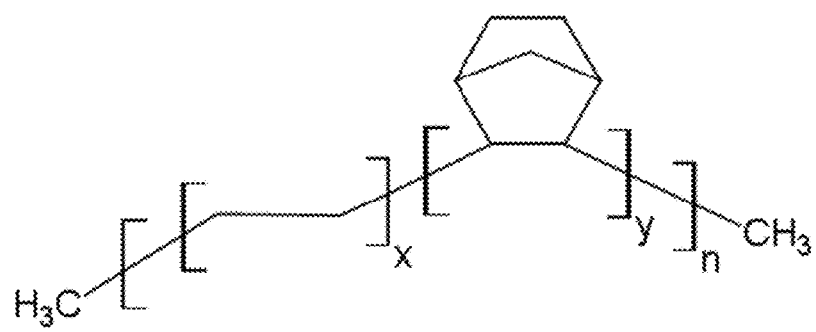
FIG. 1 depicts the chemical structure of COC.

Cyclo-olefin copolymer (COC) ferroelectrets (piezoelectric foams) produced were shown to have extremely high piezoelectric coefficient and very high thermal stability. The usable materials can be extended to other types of COCs, or cyclic-olefin copolymer (COP), blends of COC or COP and other polyolefins (PP, PE, etc.). The piezoelectric activity of the current materials are up to two orders of magnitude higher than that shown in the prior art. For appropriate stability, there must be suitable stability of the cellular structure ($T_g$ or $T_m$) and suitable stability of the charge (the temperature of charge de-trapping, $T_d$) (i.e., low water absorption and high electrical strength). COC, the chemical structure of which is shown in FIG. 1, meets these requirements, as it has low water absorption (<0.01%) and high electrical resistivity (>$10^{13}$ Ω-cm). The stability of COC is superior to any known positively charged polymer (PET, PEN, FEP, PTFE, PETP, etc.).

The $d_{33}$ of COC ferroelectrets are reported typically in the range: 10-20 pC/N, due to the stiffness of the cyclic olefins and challenging film making. The intrinsic piezoelectric coefficient, $d_{33}$ is:

$$d_{33} = \frac{x_0 \sigma_i}{Y} \cdot \frac{\varepsilon_p x_p}{(x_p + \varepsilon_p x_g)^2}$$

Figure 2A:
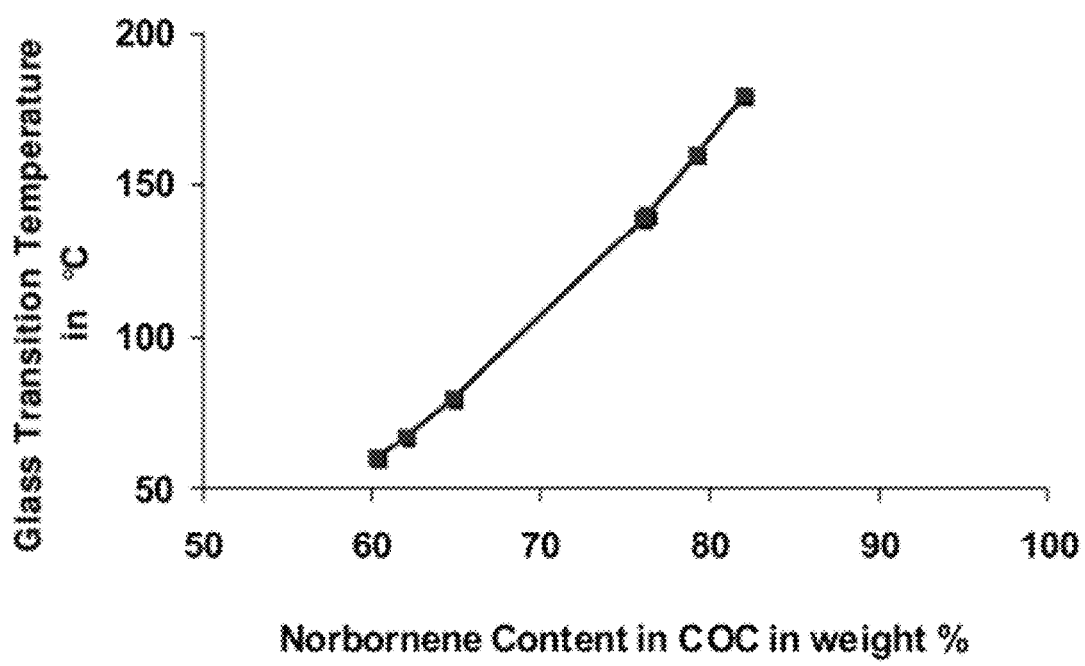
FIG. 2A graphically depicts certain chemical properties of COC.
Figure 2B:
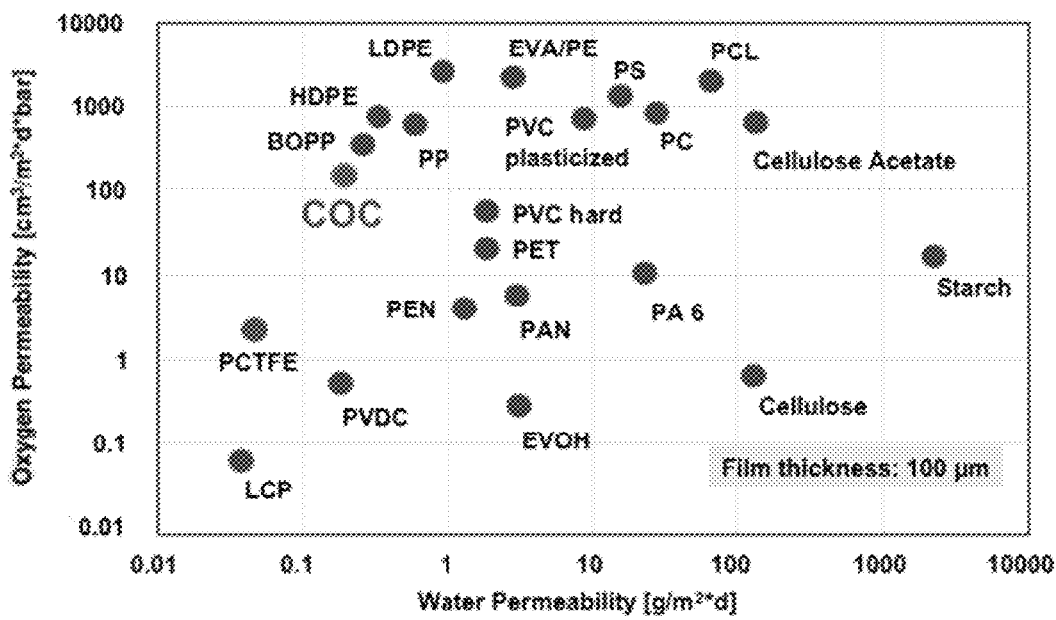
FIG. 2B graphically depicts certain chemical properties of COC.
Figure 2C:
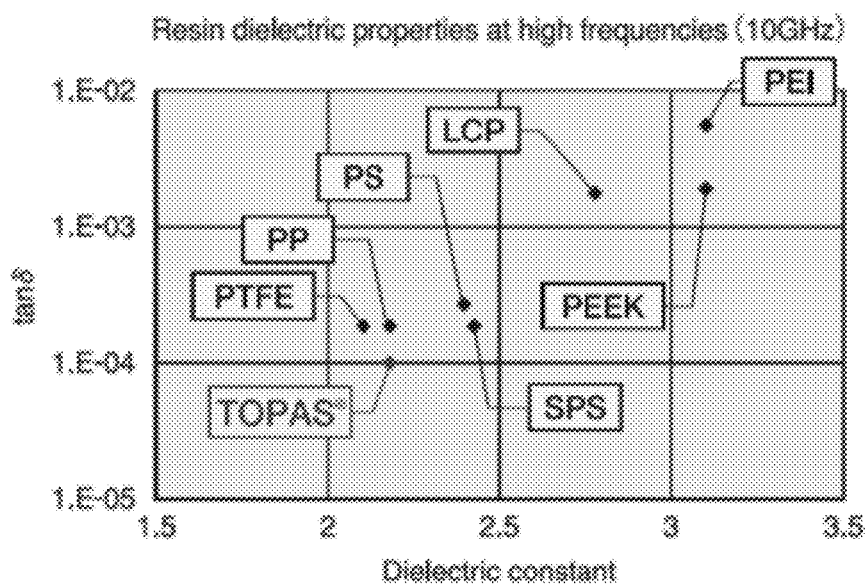
FIG. 2C graphically depicts certain chemical properties of COC.

Selected chemical properties of COC are illustrated in FIGS. 2A through 2C. FIG. 2A illustrates the change in glass transition temperature $T_g$ with increasing norborene content in the COC. The glass transition temperature can be selected over a wide range by varying the norborene content to balance the requirement for thermal stability and device flexibility. FIG. 2B illustrates the water permeability and oxygen permeability of COC as compared to other polymers. FIG. 2C illustrates the generally lower dielectric constant and dielectric loss of a COC (indicated by the trade name TOPAS).

Figure 3:
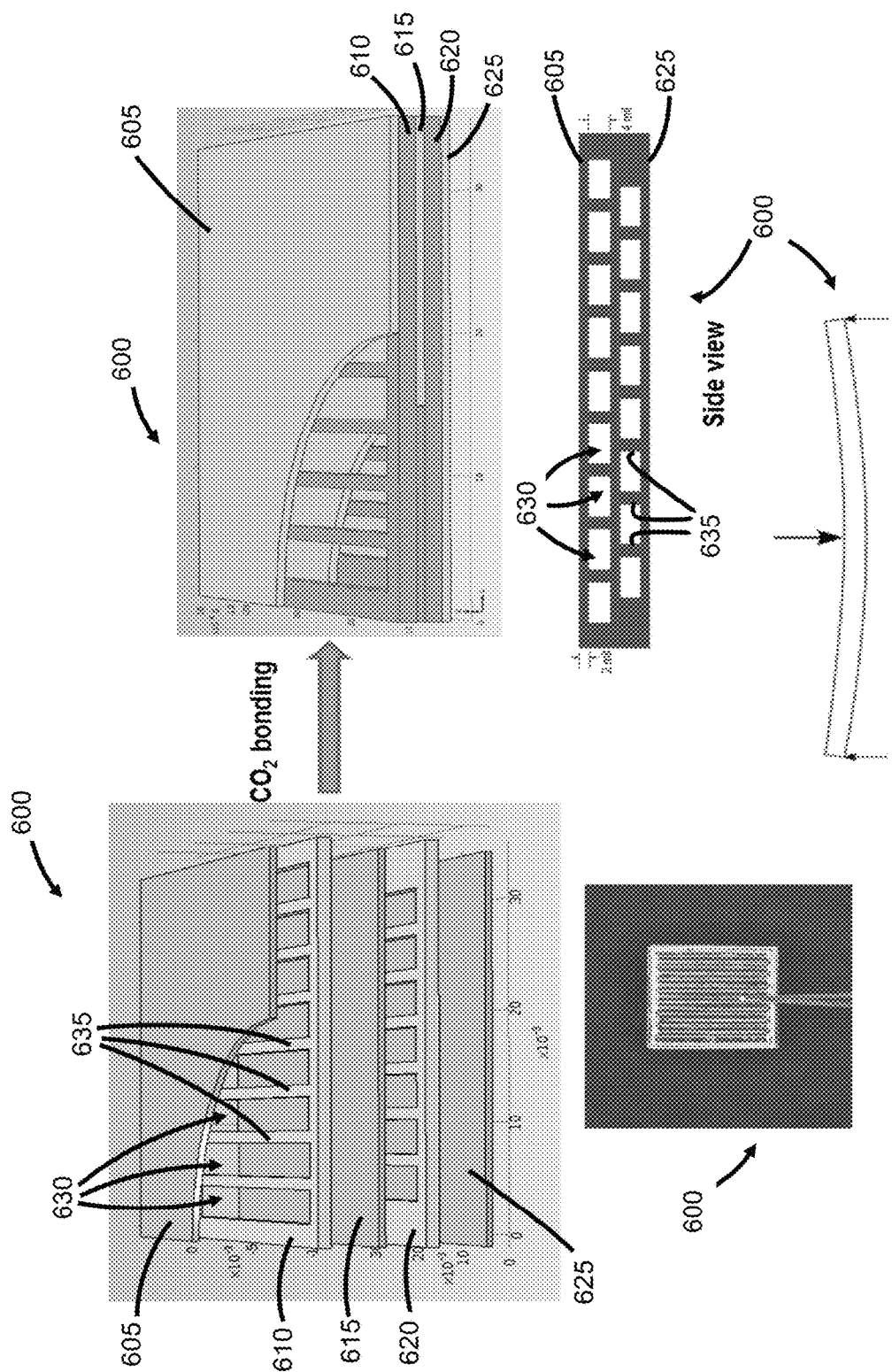
FIG. 3 is an exemplary schematic diagram of a fabrication process for a ferroelectret assembly according to certain embodiments.
Figure 5:
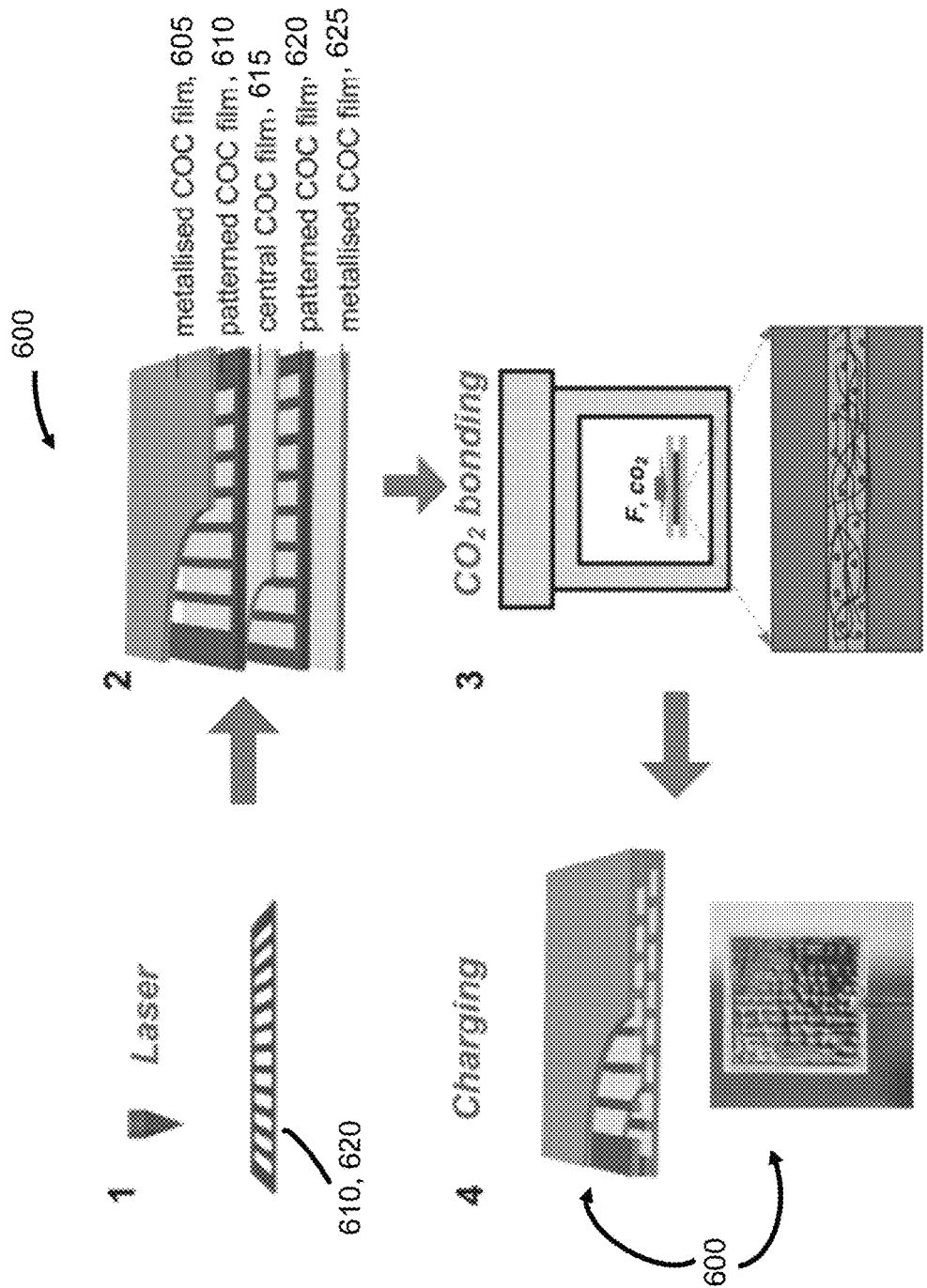
FIG. 5 is an exemplary schematic diagram of a fabrication process for a ferroelectret assembly according to certain embodiments.

A unique carbon dioxide-assisted processing method was used to assemble the COC ferroelectret assembly, which enabled fabrication temperatures tens of degrees lower than the glass transition temperature. The process is environmentally benign, as there were no residual solvent concerns on either environment or sensor performance. FIGS. 3 and 5 are schematics of the fabrication process of certain embodiments. FIG. 3 illustrates a ferroelectret 600 comprising five layers. Beginning at the top of the drawing in FIG. 3, the ferroelectret 600 may comprise a top layer 605 comprising a metallized COC film. The second layer may comprise a first patterned COC film 610, followed by a central COC film 615. The fourth layer may comprise a second patterned COC film 620. The final layer may comprise a bottom COC film 625.

The fabricated ferroelectrets may be assemblies of five-layer structures (step 2 of FIG. 5), comprising three COC films (top layer 605, central layer 615, and bottom layer 625) and two patterned COC films (first and second patterned films 610, 620). Each of the first and second patterned films 610, 620 may comprise rectangular arrays prepared by laser machining (step 1 of FIG. 5). The laser machining may remove material from the patterned film 610, 620 forming cavities 630 such that the cavities are void of material. Supports 635 define the sides of each cavity 630 and provide a supporting structure for the patterned film 610, 620. The five-layer film system (ferroelectret 600) was assembled via a $CO_2$ bonding (at 120° C. and 10 MPa $CO_2$ pressure) with good bonding strength (1.8 MPa). While FIG. 3 depicts a five-layer ferroelectret 600, various embodiments may comprise fewer or greater layers. Additionally, although rectangular cavities 630 are illustrated, cavities of any shape are contemplated, as is the total number of cavities 630. In various embodiments, each of the first and second patterned layers 610, 620 may comprise a variety of differently shaped cavities 630 (that is, not all of the cavities 630 need be rectangular cavities as illustrated in FIG. 3) which may be arranged in symmetrical or nonsymmetrical patterns.

In the embodiments illustrated in FIG. 3, first patterned layer 610 may not be identical to second patterned layer 620. As can be more clearly seen in the side view of FIG. 3, the cavities 630 of the first patterned layer 610 may be horizontally (as viewed in FIG. 3) offset a certain amount from the cavities 630 of the second patterned layer 620. While FIG. 3 illustrates that the cavities 630 of the first and second patterned layers 610, 620 are offset by about half the width of the cavities 630, other offsets are also contemplated.

Figure 4:
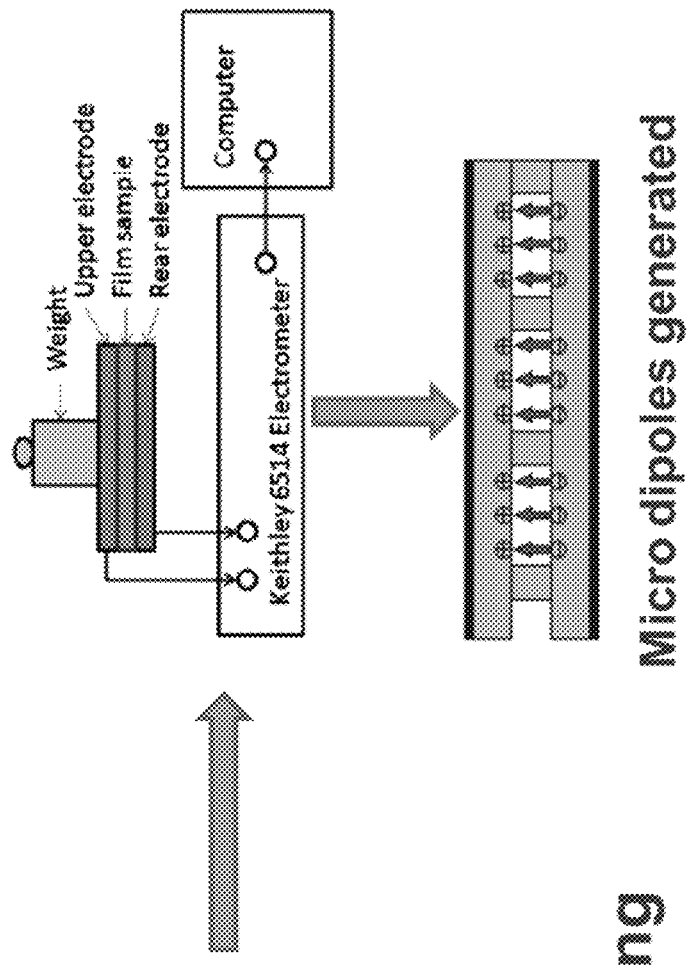
FIG. 4 depicts the charging process and piezoelectric measurements.
Figure 4:
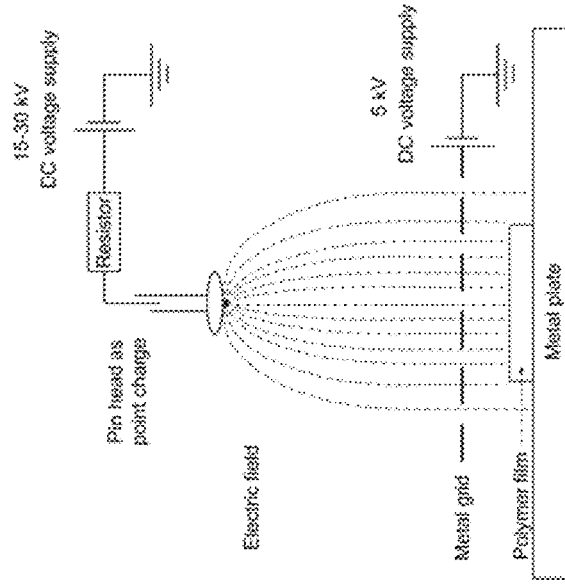

FIG. 4 depicts the charging process and piezoelectric measurements. Thus far various embodiments have used contact charging. Corona methods are considerably refined and adapted for controlled and stable charging, resulting in improved piezoelectric activity of COC ferroelectrets.

Figure 6:
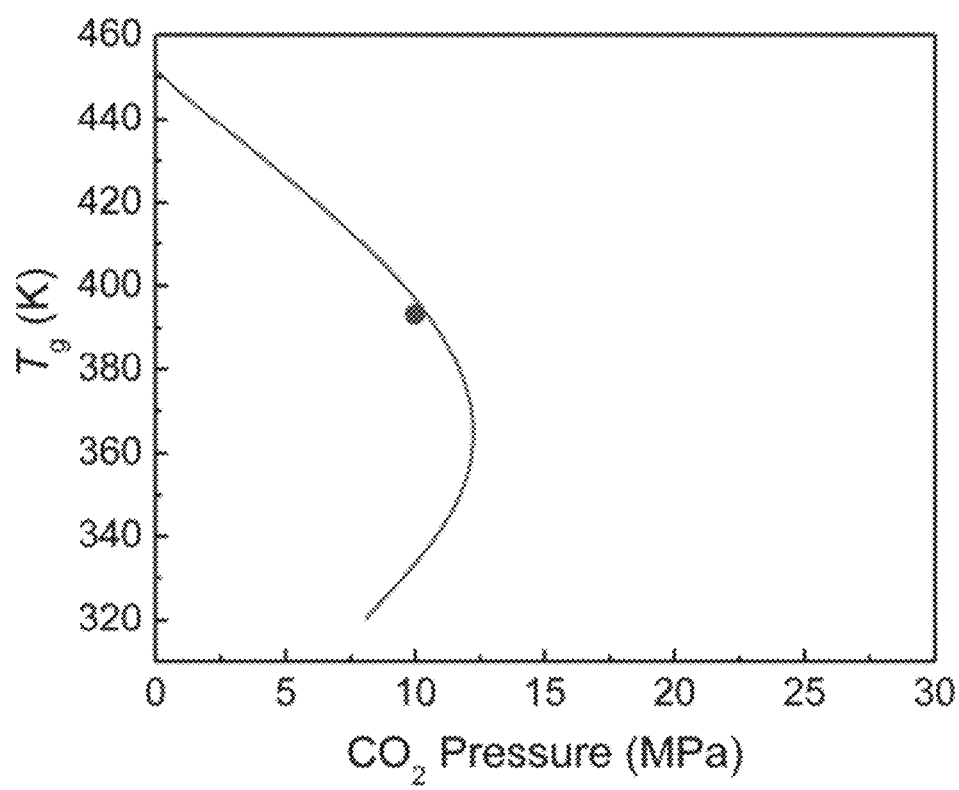
FIG. 6 is a graph of the glass transition temperature of the COC—$CO_2$ system which may be used for the selection of bonding conditions.

During bonding, polymer interfaces undergo interfacial wetting, diffusion, and randomization to forge the bonded interface. [85] Assembly of the ferroelectrets at the aforementioned condition is possible because the fundamental physical processes that govern the polymer bonding are greatly facilitated by $CO_2$, which can dissolve in substantial amount in COCs. This significantly enhances the polymer chain mobility and diffusion, reducing the temperature required for the polymer chain inter-diffusion and development of a bonded interface. The glass transition temperature of the COC—$CO_2$ system (FIG. 6) has been calculated to guide the selection of bonding conditions. FIG. 6 is a graph of the glass transition temperature ($T_g$) of the COC 6017-$CO_2$ system and may be used for the selection of bonding conditions. The point on the graph indicates the selected bonding conditions for various embodiments. The bonding temperature is slightly under the bulk $T_g$ to prevent the deformation of the overall structure. Because of the enhanced mobility of surface polymer chain ends and lower surface $T_g$, interchain diffusion readily enabled the development of the bonded interface. In various embodiments, the $T_g$-$CO_2$ pressure diagram of FIG. 6 may be used to select the right combination of bonding temperature and pressure to achieve a desired balance between bonding strength, feature fidelity preservation, and bonding time (for productivity).

The glass transition temperature profile was calculated by using the Sanchez-Lacomb equation of state (SL-EoS) [86, 87] and applying the Gibbs-DiMarzio thermodynamic criterion for glass transition, following the thermodynamic framework developed by Condo et al. [88] The selected bonding temperature is slightly lower than the bulk $T_g$ of the COC—$CO_2$ solution at 10 MPa $CO_2$ pressure, so that the bulk deformation of the predefined structure is prevented since the polymer chain motions are inhibited. On the other hand, the surface $T_g$ can be substantially lower than that of the bulk $T_g$ [89] and the polymer chains near the surfaces possess significantly higher mobility and diffusivity. Therefore, polymer chains inter-diffusion readily proceeds to enable bonding. Similar principles were used in fabricating micro and nano-scale polymer assemblies. [90-92]

Previous modeling of ferroelectrets has yielded the following relationship [93]:

$$d_{33} \propto K \frac{\sigma_{\mathit{eff}}}{E}$$

where $d_{33}$ is the piezoelectric activity, K is a structure-related constant, $\sigma_{\mathit{eff}}$ is the effective polarization in the ferroelectret, and E is the compression modulus. It follows that the piezoelectric $d_{33}$ coefficient is inversely proportional to the compression modulus of the ferroelectrets. To improve the piezoelectric activity, many groups have attempted to reduce the compression modulus by fabricating a porous sandwich structure. [53, 54, 74-81] For example, Altafim et al. [76-78] prepared single- and multilayer FEP ferroelectrets with well-controlled open-channel structures using a thermal lamination technique. A similar approach was also adopted to fabricate polyethylene (PE) ferroelectrets and their piezoelectric properties were compared with those of FEP ferroelectrets. [79] Fluorocarbon films have been fabricated with regular void structure consisting of compact FEP and patterned porous polytetrafluoroethylene (PTFE) layer by using a metal mesh and similar fusing bonding process. [81] These results suggest that it is possible to enhance the resulting piezoelectricity by careful tuning of the porous structures during preparation. Nevertheless they also noted the limited extent of improvement by this approach. While the exact mechanisms deserve further investigation, it is hypothesized that that the limited extent of reduction of the compression module in their structure, which is mainly dictated by the overall porosity of the sandwich structure, might be responsible for the observed limitation. [34]

Figure 7:
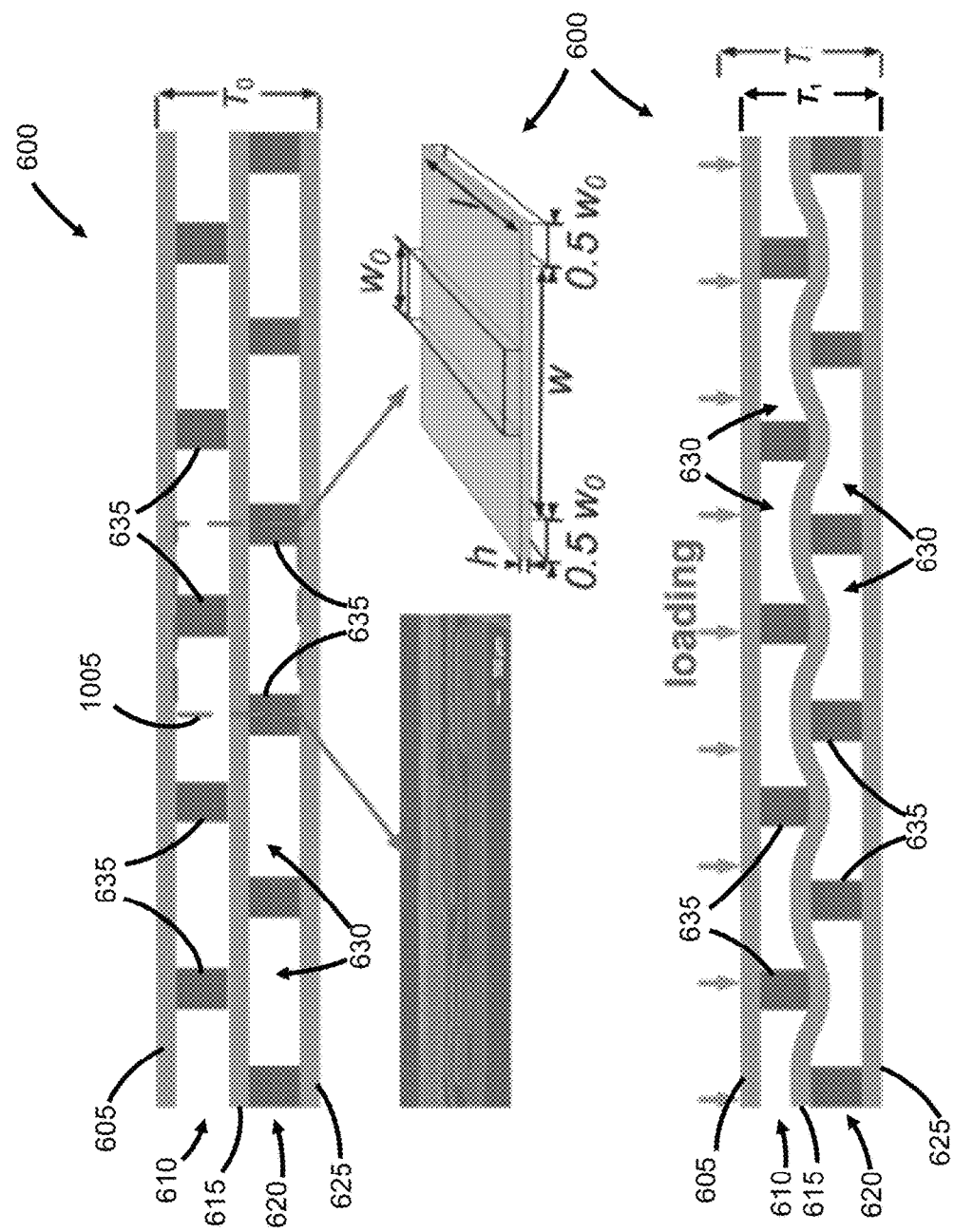
FIG. 7 depicts exemplary schematic diagrams showing the structure of a ferroelectret assembly, and the compression of the assembly when subjected to a load.

Various embodiments achieve the reduction of the overall compression modulus of the ferroelectrets by implementing a bending mechanism in the basic structure, using a multipoint, long, clamped plate configuration in the pattern design. FIG. 7 shows the schematic view of this plate structure of the ferroelectret 600. The basic structure or "unit cell" 1005 (depicted by the box with dashed lines in FIG. 7) is a long plate comprising the top layer 605 and the bottom layer 625. Two rigid supports 635 may be spaced apart forming cavity 630 therebetween and positioned between the central layer 615 and the bottom layer 625. The two supports may be coupled to the bottom layer 625. A third rigid support 635 may be positioned between the top layer 605 and the central layer 615 and may be coupled to the top layer 605 and positioned between the two lower supports 635. In various embodiments, the upper support 635 is positioned centrally between the two lower supports 635. In other embodiments, the upper support 635 may be positioned closer to one of the lower supports 635 than the other lower support 635. This structure allows the compression of the overall ferroelectrets to be realized by the bending of the "unit cell" by applying a load to the plate. When the load is applied to the ferroelectret 600, the central layer 615 may flex or stretch, allowing a thickness of the ferroelectret to compress from an original thickness $T_0$ to a compressed thickness $T_1$ less than $T_0$. By varying the design parameters of the "unit cell" (e.g., thickness (h), width (w), and length (l)), the compression modulus of the ferroelectrets can be tailored over a very broad range.

Figure 8:
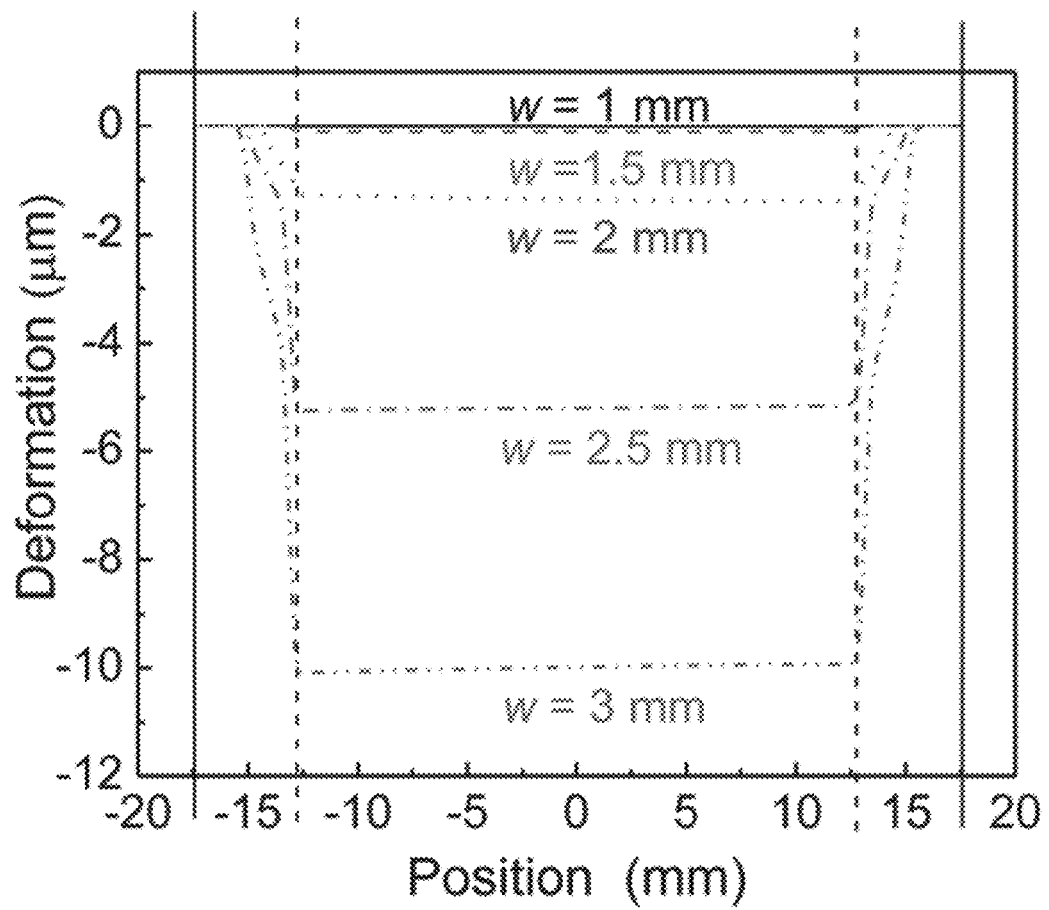
FIG. 8 is a graph depicting finite element modeling results of overall deformation in the thickness direction of a ferroelectret for different geometries.
Figure 9:
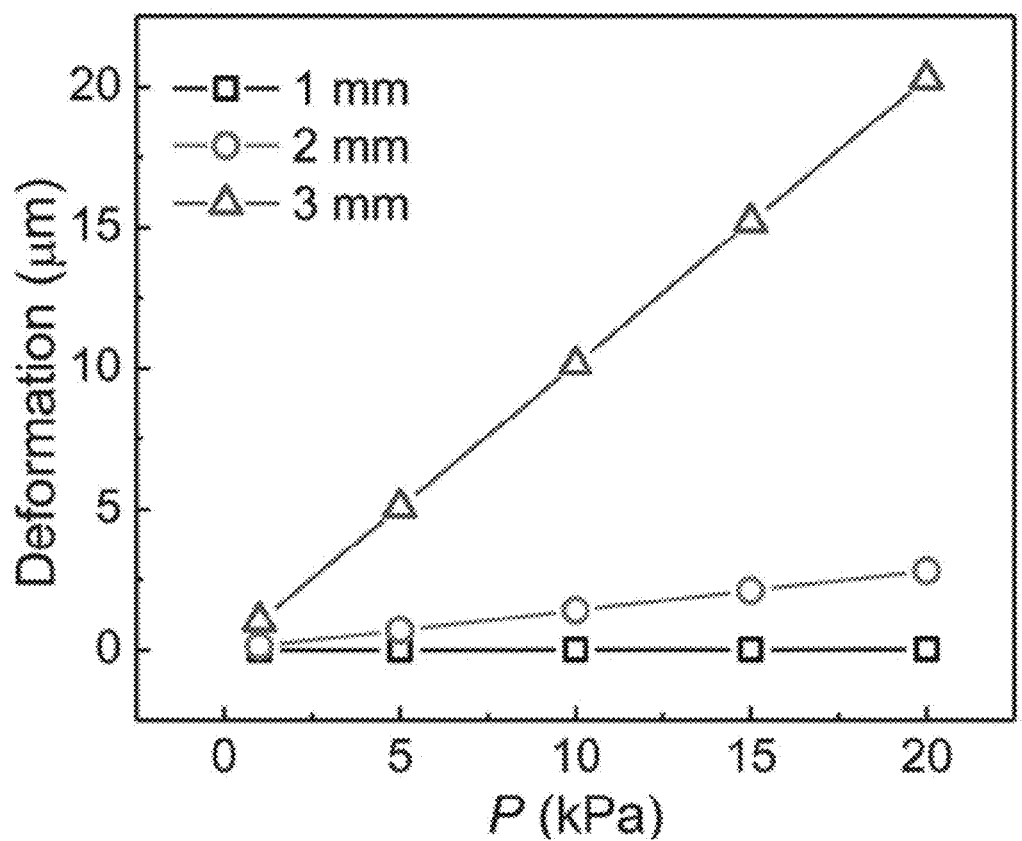
FIG. 9 is a graph depicting simulated deformation in the thickness direction of a ferroelectret for different designs subjected to a series of loads.

Finite element analysis was conducted to verify this. Thus, several assemblies with different structural parameters were subjected to a series of applied compression loads and the deformation in the thickness direction was modeled by using COMSOL software and the results are shown in FIG. 8. A wide range of deformation can be realized by varying w. Furthermore, the deformation is very uniform across the loaded area (FIG. 8), and is proportional with the applied load (FIG. 9), revealing that bending is the dominant deformation mechanism. [94-96]

The effective compression modulus E for COC ferroelectrets was calculated by using the applied pressure and simulated deformation. They are in the range of 0.3 MPa (w=3 mm) to 270 MPa (w=1 mm), orders of magnitude lower than the bulk modulus of COC (3 GPa), [97] demonstrating the effectiveness of this type of structure to reduce the compression modulus for potentially higher piezoelectric activity. It is envisaged that the piezoelectric $d_{33}$ can be further tailored by the grid design and change of the effective compression modulus of the ferroelectrets.

Figure 10:
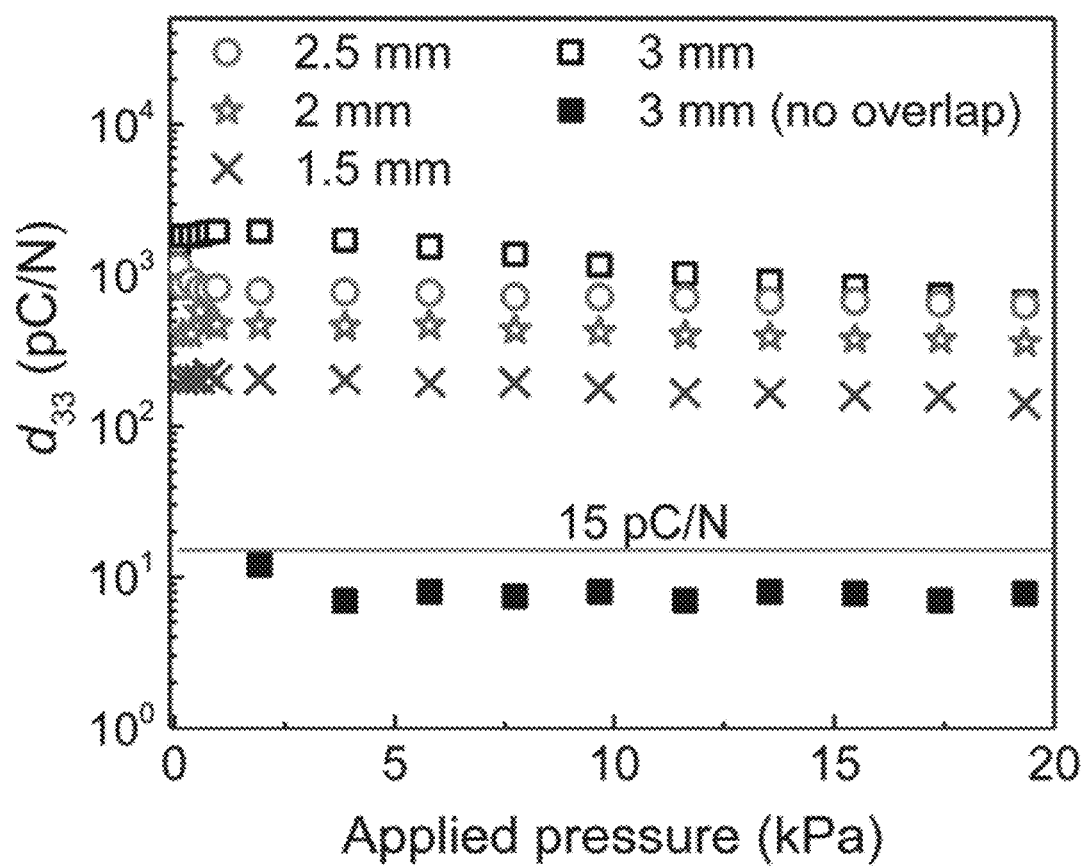
FIG. 10 is a graph of quasi-static piezoelectric coefficient $d_{33}$ of a series of ferroelectrets with different designs.
Figure 11:
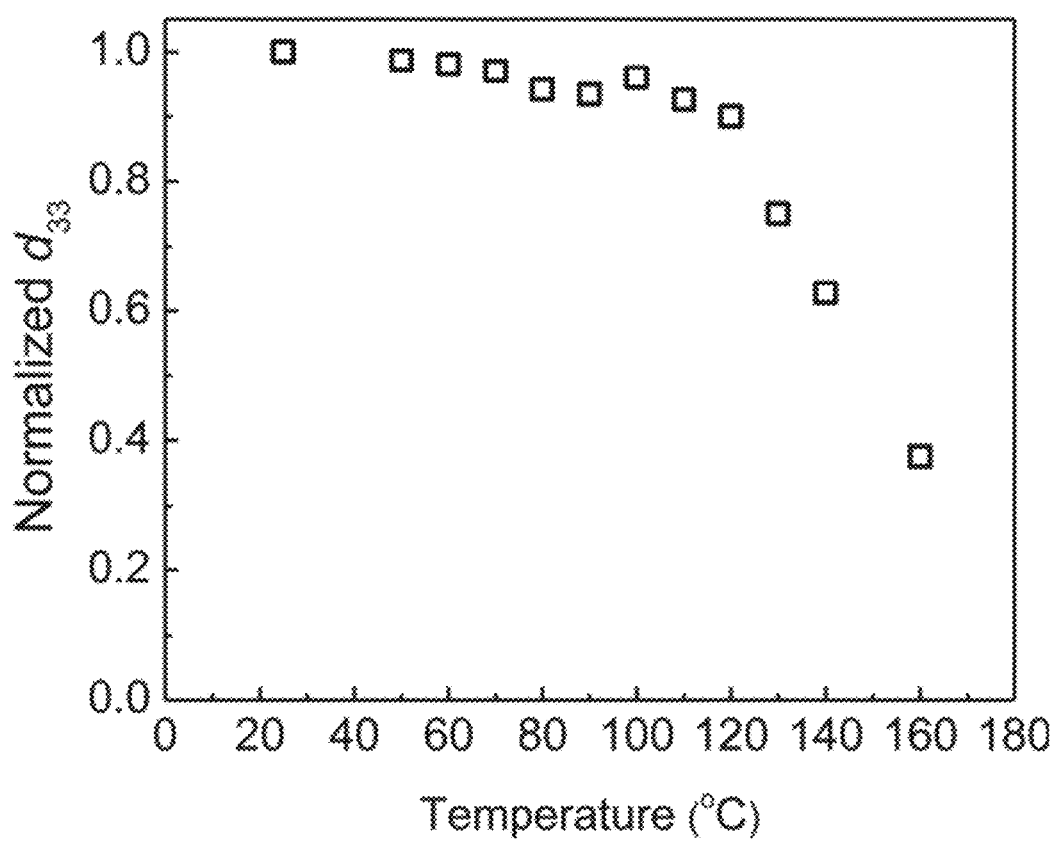
FIG. 11 is a graph of normalized piezoelectric activity of a ferroelectret as a function of annealing temperature.
Figure 12:
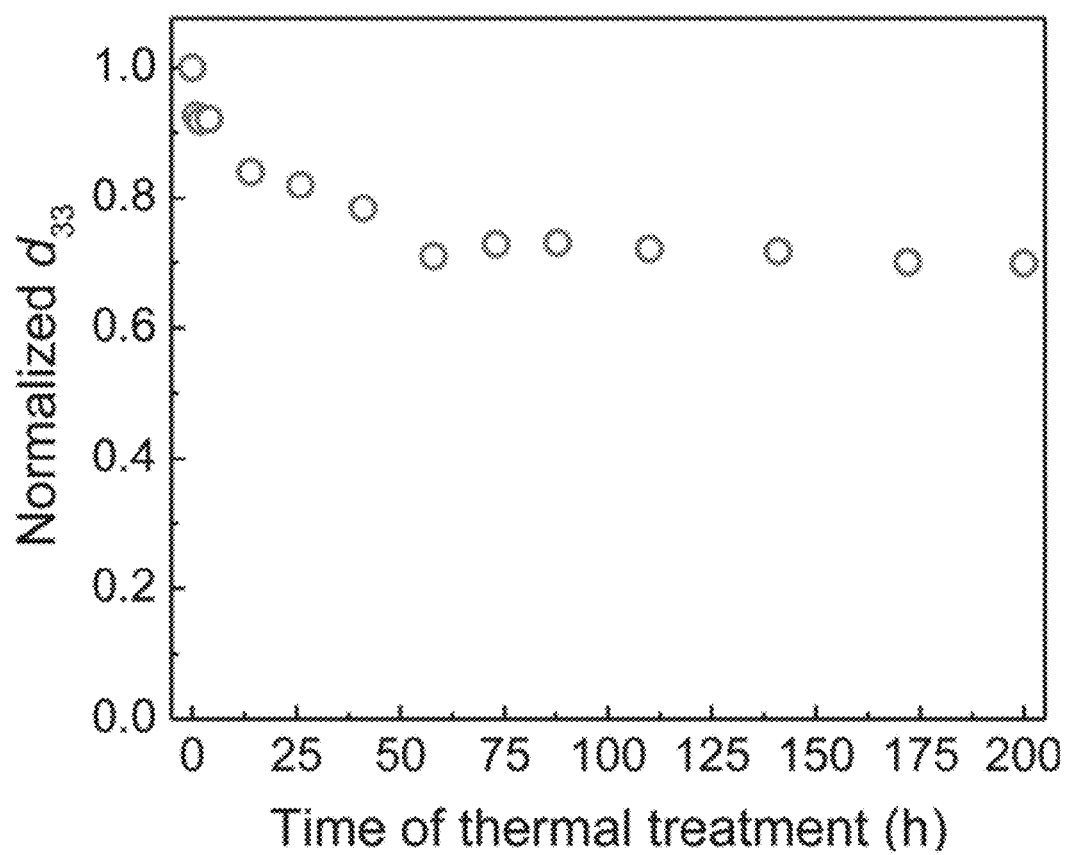
FIG. 12 is a graph of normalized piezoelectric activity of a ferroelectret as a function of time at 120° C.

A series of ferroelectrets was fabricated using the same grid design simulated in FIG. 8. Depending on the fabrication conditions and geometry design, the piezoelectric foams may exhibit different pressure dependency and thermal stability. FIGS. 10 through 12 are representative of various embodiments with pressure independent $d_{33}$. FIGS. 13 through 16 are representative of various embodiments with pressure dependent $d_{33}$.

FIG. 10 shows their piezoelectric coefficient $d_{33}$. These ferroelectrets are in the range of 102-103 pC/N, 1-2 orders of magnitude higher than the 15 pC/N previously achieved. [38, 39, 67] For comparison, a ferroelectret without the aforementioned offset structure was fabricated (w=3 mm). The bending mechanism is disabled by aligning their respective geometric features (rectangular cavities and ridges) of the two patterned films in the vertical direction. The $d_{33}$ of this ferroelectret was also measured, as shown in FIG. 10 (filled square). The $d_{33}$ is 10 pC/N. In comparison, the ferroelectrets with the same geometric design but with bending mechanism enabled (FIG. 10, open square) show $d_{33} \approx 1,000$ pC/N over the entire pressure range, a powerful manifestation of various embodiments.

The piezoelectric coefficient $d_{33}$ is almost independent of the applied pressure, though for a wide grid (w=3 mm) a deviation from linear scaling occurs at higher pressures due to reduced structure stability. Thus, care needs to be taken in balancing the high piezoelectric activity and structure stability in the design of COC ferroelectrets.

Short-term thermal stability of the COC ferroelectrets was examined by measuring the $d_{33}$ after annealing the samples at a series of temperatures. As shown in FIG. 11, the COC ferroelectrets exhibit excellent thermal stability, with $d_{33}$ retaining 90% of the initial value even at 120° C. Decay of $d_{33}$, due to the thermally stimulated discharge process accelerated at temperatures higher than 120° C., but is still relatively slow compared with other polymer ferroelectrets. Even when heated to 160° C., the $d_{33}$ retains over 35% of the initial value.

The isothermal decay of the piezoelectric $d_{33}$ coefficients of the COC ferroelectrets were studied at 110° C. (long-term thermal stability test) and are depicted in FIG. 12. The initial decay of the piezoelectric $d_{33}$ coefficients of COC ferroelectrets is probably due to the combined effect of the aging of the material elasticity and a loss of unstable charges in the films. [57] The $d_{33}$ reaches a stable value after 50 h of annealing, and remained essentially constant thereafter. After 200 h at 110° C., the ds coefficient maintains 70% of the initial value, demonstrating the superiority of the COC ferroelectrets of various embodiments: high piezoelectric activity with excellent long-term thermal stability.

Figure 13:
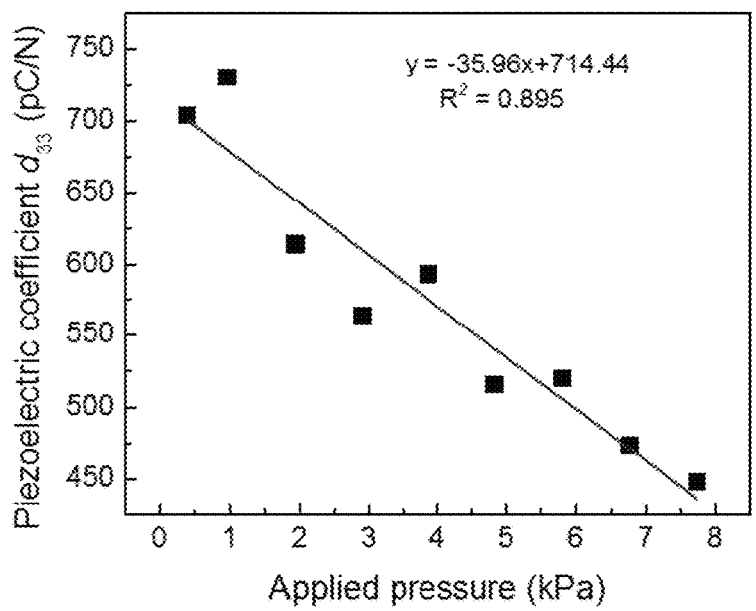
FIG. 13 shows $d_{33}$ as a function of the static stress for COC ferroelectrets.
Figure 14:
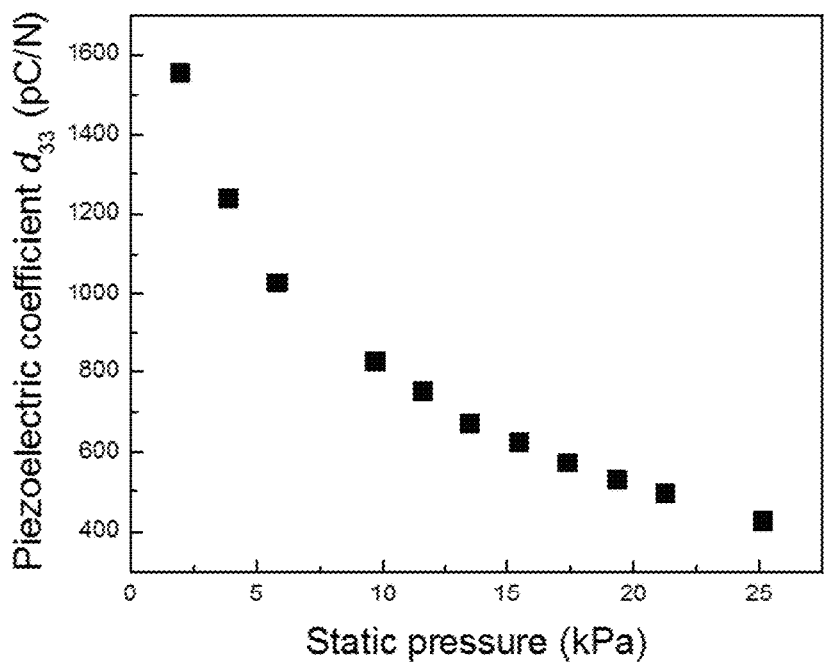
FIG. 14 shows $d_{33}$ as a function of the applied pressure for COC ferroelectrets.
Figure 15:
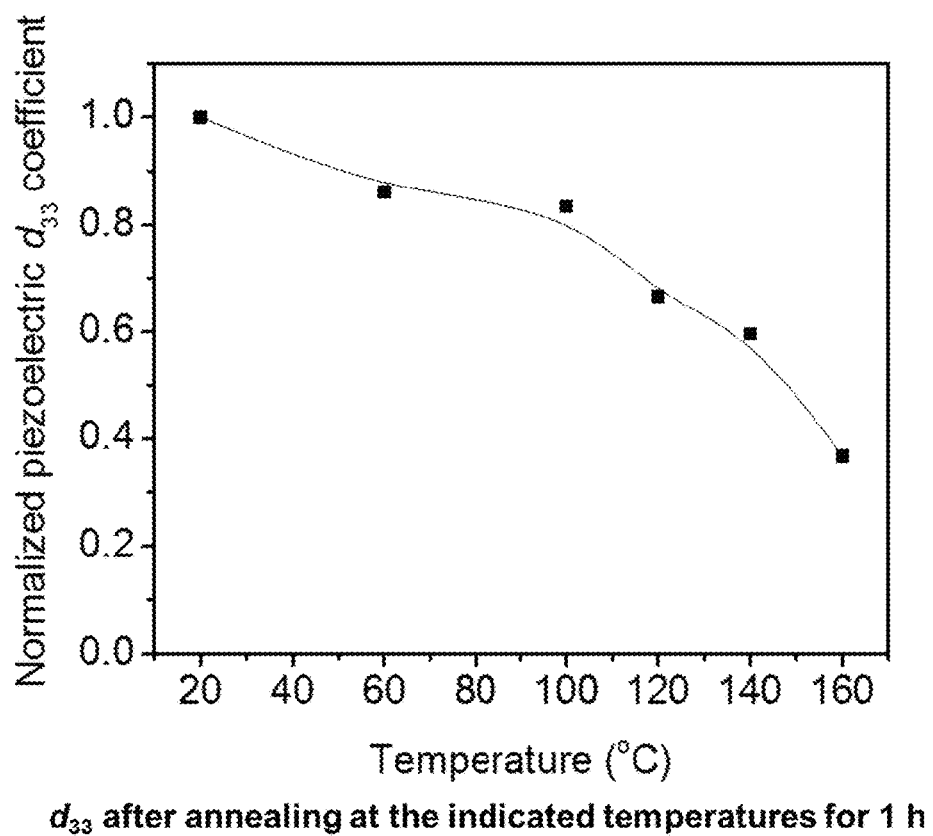
FIG. 15 graphically depicts thermal stability for COC ferroelectrets.
Figure 16:
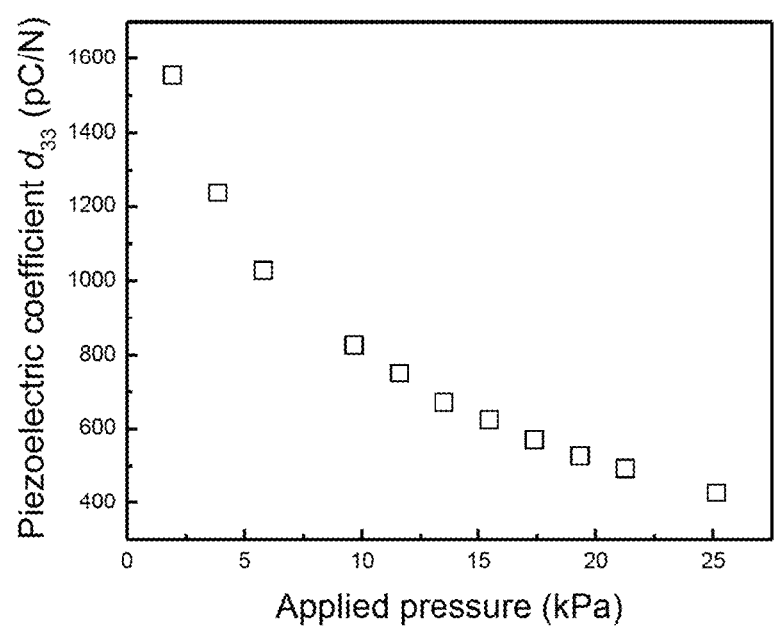
FIG. 16 depicts quasi-static piezoelectric coefficient $d_{33}$ as a function of applied pressure.

FIG. 13 illustrates pressure dependent $d_{33}$ as a function of the static stress for COC ferroelectrets, thereby showing its quasi-piezoelectric activities. FIG. 14 graphically depicts further pressure dependent piezoelectric activities. FIG. 15 depicts thermal stability for COC ferroelectrets with pressure dependent $d_{33}$. COC ferroelectrets may show much more thermal stability, compared to PP ferroelectrets. FIG. 16 shows $d_{33}$ as a function of the static stress for COC ferroelectrets.

Various embodiments demonstrate an innovative technology to fabricate COC ferroelectrets by $CO_2$-assisted assembly of patterned structures from laser machining. Using a multilayer structural design to implement a bending mechanism in the ferroelectrets, the apparent compression modulus can be greatly reduced and tailored, leading to COC ferroelectrets with excellent piezoelectric activity. The COC ferroelectrets exhibit excellent thermal stability. Various embodiments presented a viable low-cost technology to mass produce COC ferroelectrets with high piezoelectric activity in both low- and medium-pressure regimes (0.1-20 kPa) that can be used in structurally and thermally demanding conditions.

Applications

The activity, and linearity and bandwidth response characteristics can be tailored by pattern design. These characteristics can be further tailored by stacking multiple layered structures. They can be used in exemplary applications as described herein, with the unique advantages realized in the highly thermally stability and highly active COC materials.

Thermoelectric Materials Application

Thermoelectric (TE) materials generate energy in the presence of temperature differential by virtue of converting thermal energy to electrical energy. Combinations of different semiconductors are the dominant thermoelectric materials. Currently most of the research on TE materials has been focused on inorganic substance. The applications of most TE materials are limited to high temperature regime (>200° C.), which has restricted their application area. Various embodiments of COC ferroelectrets described herein can form the basis of novel thermoelectric device for harvesting thermal energy that can be operated at lower temperatures.

Figure 17:
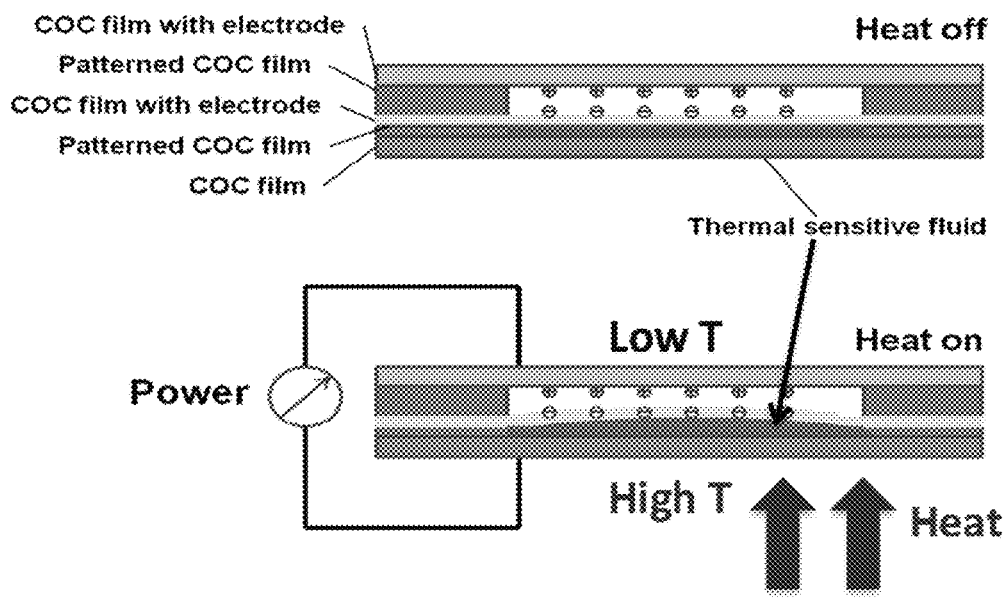
FIG. 17 is an exemplary schematic diagram of thermally activated piezoelectric device (pseudo-thermoelectric device).

FIG. 17 is a schematic of a COC ferroelectret based TE device. The basic structure depicts the ferroelectrets that showed extremely high piezoelectric activity. The top layer is COC film with electrode. The second layer is a patterned COC film prepared by laser cutting. The third layer is COC film. The difference is now a fourth COC layer is introduced, which contains cavities encapsulated with a temperature-sensitive fluid. The bottom layer is a COC film with electrode.

The working principles are as follows. When there is no temperature differential (FIG. 17, "Heat Off"), the COC ferroelectrets possess a certain macro-dipole. When the two sides of the ferroelectrets are subjected to a temperature differential (FIG. 17, "Heat On"), the thermally sensitive fluid would expand and exert a force in the thickness direction, which changes the macro-dipole and results in an external current flow. This may be referred to as pseudo-pyroelectric phenomenon, which gives rise to the pseudo-thermoelectric characteristics of such device.

Enhancement of Piezoelectricity Via a Patterned Cover Layer

Figure 18:
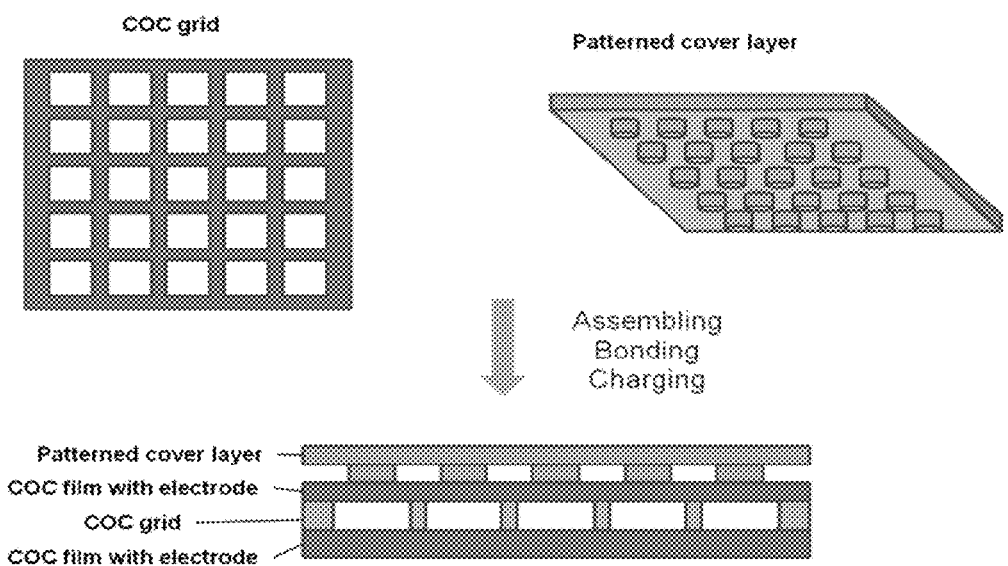
FIG. 18 is an exemplary schematic diagram of a design for a COC ferroelectret.

As depicted in FIG. 18, the structure of exemplary COC ferroelectrets is a three-layer sandwich structure with voids. The procedure is similar as the previous described, normally including: cutting, assembling, bonding and charging. However, this type of COC ferroelectret usually exhibits low piezoelectric activity due to their high elastic stiffness in the thickness direction. In order to overcome this drawback, a patterned cover layer was assembled on the top of COC ferroelectrets. This design could easily produce the applied load on the cover layer to COC ferroelectrets and effectively deform the charged void, leading to macroscopic dipoles moments change. Here, the findings provide a valid and cost effective process to create a simple three-layer sandwich COC ferroelectret system with high piezoelectric activity.

Note that the combinations of the pattern design of the layers are limitless (such as spacing between features, feature geometry, etc.) which can be adjust to produce ferroelectrets with different combination of piezoelectric activity, bandwidth characteristics, and mechanical properties. This will enable even higher performance in both sensing and actuation. They will be suitable for uses as sensors of different sensitivity, and actuators requiring different force characteristics. Further stacking of the units is possible again by $CO_2$ bonding.

Super Thermo Stable COC Ferroelectrets

Figure 19:
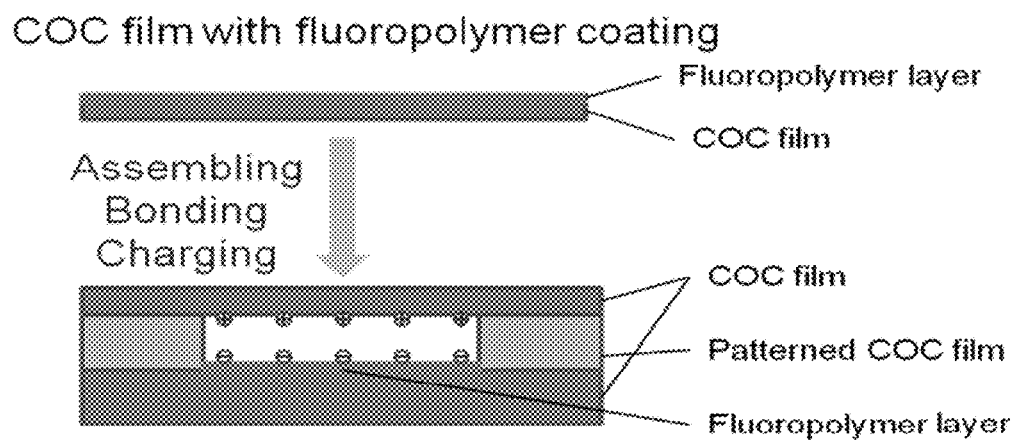
FIG. 19 is an exemplary schematic diagram of thermally stable COC ferroelectrets.

As depicted in FIG. 19, the stability of the piezo- and pyroelectric activity under various conditions is of utmost importance for industrial applications of such materials. Although COCs have shown better positive charge stability than other polymers, it should be note that negative bulk charges in COC are less stable. Fluoropolymers, particular β-phase fluoropolymers, exhibit better negative charge stability than COC. Here, a novel method is presented to further improve the thermo stability of COC ferroelectrets via fluoropolymer coating.

A multi-layer structure COC film was fabricated. The patterned COC film was fabricated using laser cutting as described previously. Fluoropolymers were deposited on the top surface of COC films. Then the multi-layer COC films were assembling and bonded. Afterwards the multi-layer COC films were coated on the top and bottom surfaces and implanted under strong electric fields.

Design for Integrated Piezoelectric Sensors for Distributed Sensing

Figure 20:
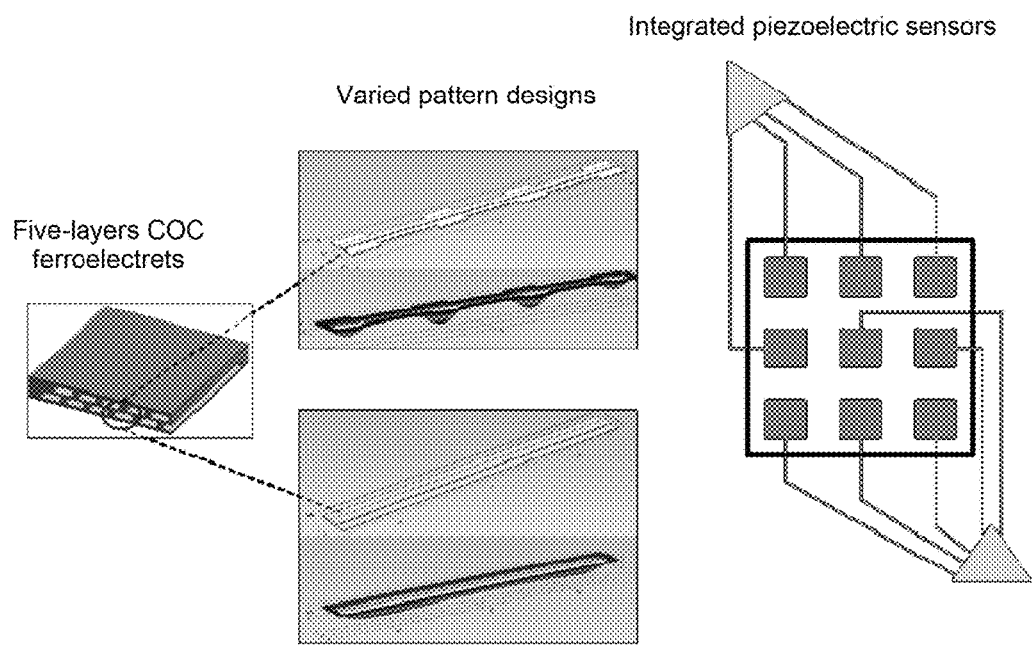
FIG. 20 is an exemplary schematic diagram of integrated piezoelectric sensor devices and illustrates an example structure of the base ferroelectrets for an integrated piezoelectric sensor network, exemplary designs for a sensor which may have different pressure response characteristics, and an exemplary schematic diagram of an integrated piezoelectric sensor.

Over the last decade, piezoelectric sensors systems have been widely applied in varied application such as touch devices. Usually, the integrated system can be produced by one-by-one assembly. Here, a novel and efficient integrated piezoelectric sensor is fabricated via one-step method by employing laser cutting and $CO_2$ bonding techniques (FIG. 20). The fabrication approach of COC ferroelectrets is similar to that previous described. It should be noted that a key factor is that the design of the COC grid can be varied to a great extent, which has been facilitated by CAD-based predictive design. The integrated system can be easily adjusted by simply changing the grid structure. Furthermore, the linear response piezoelectric activity in the integrated system could be predicted for a refined structure. Such sensor networks are in principle very large in size, which will be useful, among others, for distributed sensing.

Figure 21:
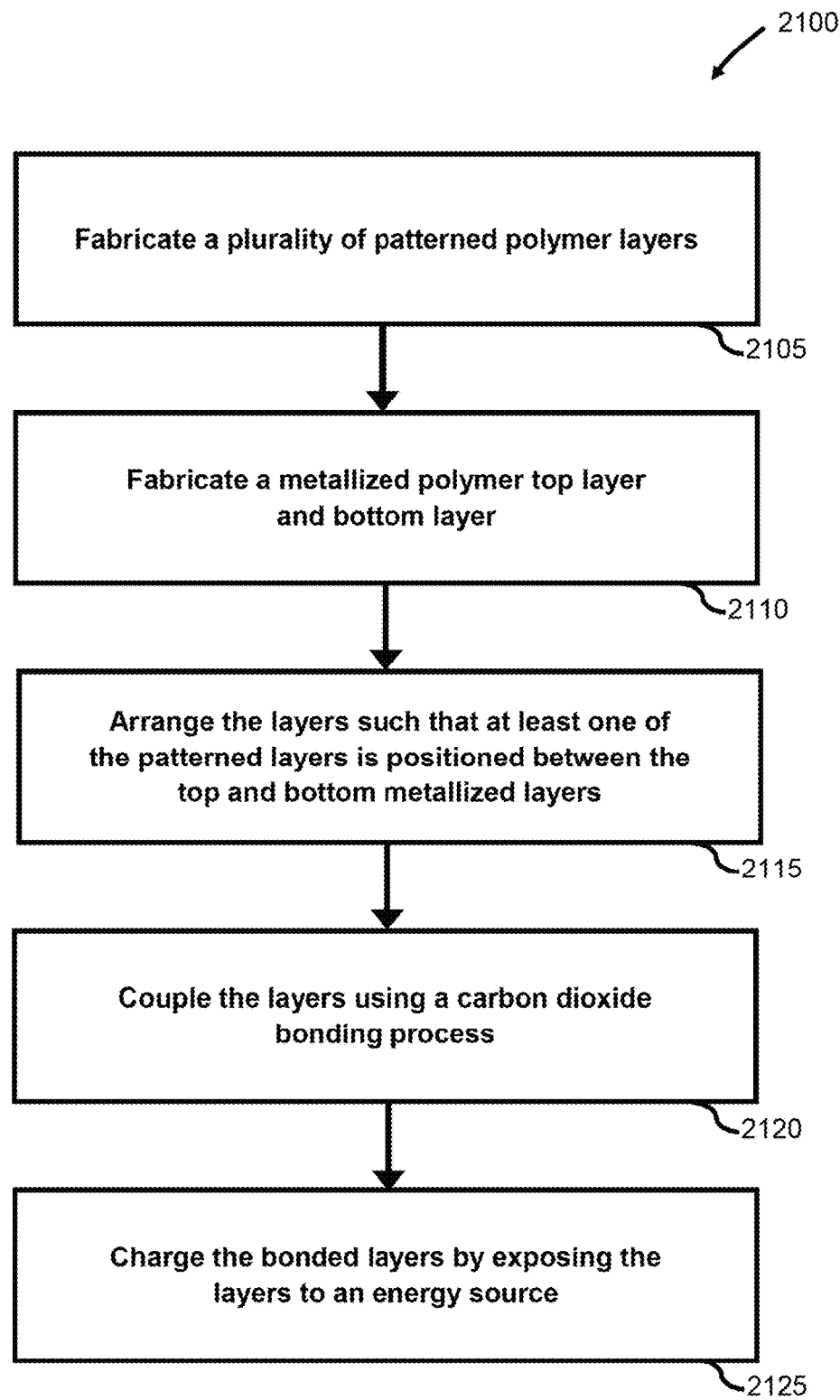
FIG. 21 is an exemplary flow diagram of a method for producing a multilayer polymer ferroelectret according to various embodiments.

FIG. 21 is a flowchart of an exemplary method 2100 for producing a multilayer polymer ferroelectret according to various embodiments. A plurality of patterned polymer layers 610, 620 are fabricated at step 2105. The patterned layers 610,620 may each comprise a plurality of cavities 630 separated by support structures 635. The cavities 630 may be voids in the patterned layer 610, 620 in which no material is present. The support structures 635 may separate each of the cavities 630. At step 2110, a metallized polymer top layer 605 and a metallized polymer bottom layer 625 are fabricated. The layers are then arranged at step 2115 such that at least one of the patterned layers 610, 620 is positioned between the top metallized layer 605 and the bottom metallized layer 625 to form an assembly. The layers of the assembly are then coupled together using a carbon dioxide bonding process at step 2120. The carbon dioxide bonding process may dissolve carbon dioxide into the polymer layers. In various embodiments, the polymer layers may be essentially saturated with carbon dioxide. At step 2125, the bonded layers of the assembly are charged by subjecting the assembly to an energy source. The energy source may, for example, be a corona discharge or electric current or field, or may be any process known in the art to impose an electric charge within the assembly.

Figure 22:
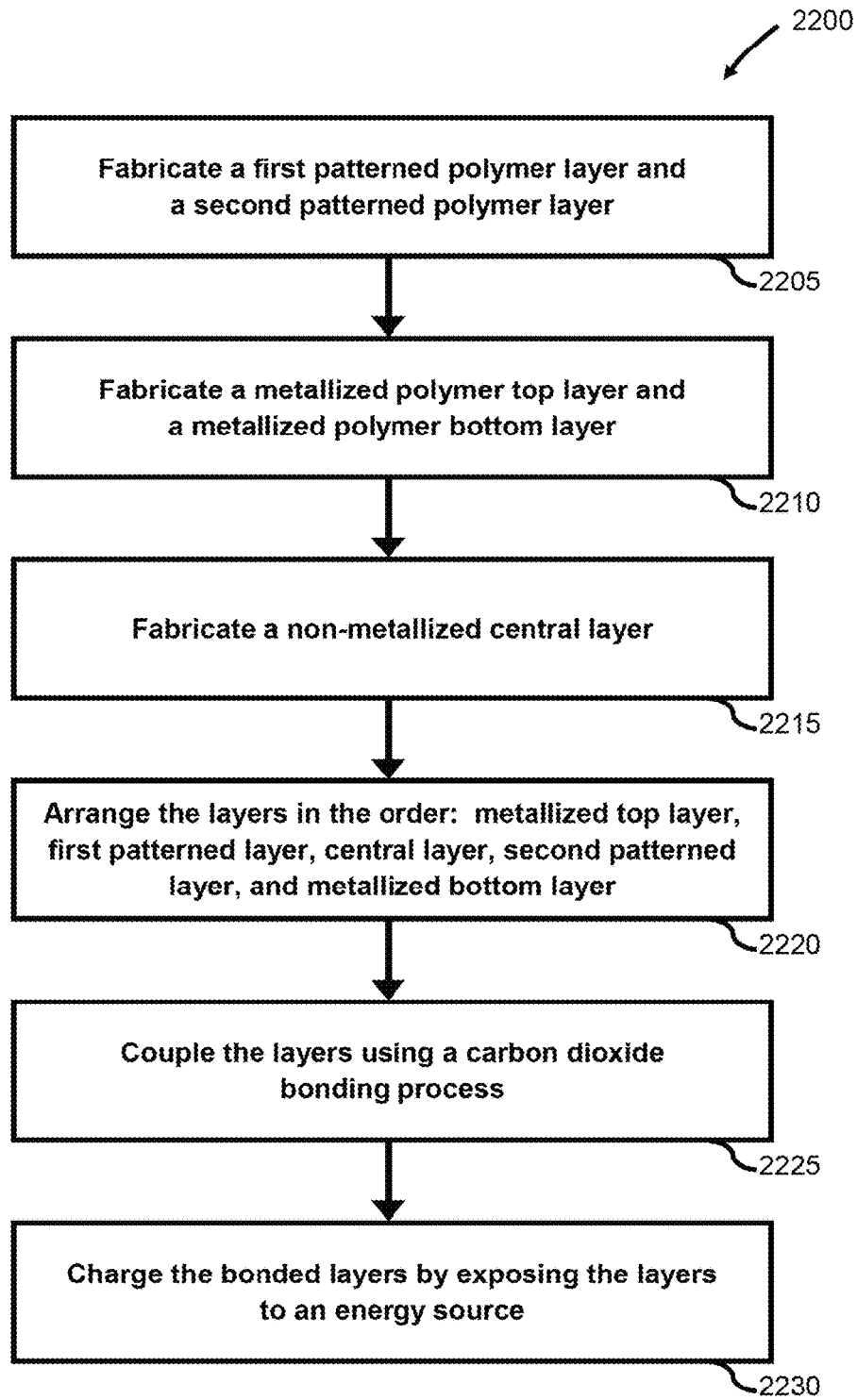
FIG. 22 is an exemplary flow diagram of a method for producing a multilayer polymer ferroelectret according to various embodiments.

FIG. 22 is a flowchart of yet another exemplary method 2200 for producing a multilayer polymer ferroelectret according to various embodiments. At step 2205, a first patterned polymer layer 610 and a second patterned polymer layer 620 are fabricated. Each of the first and second patterned layers 610, 620 comprise a plurality of cavities 630 separated by support structures 635. The cavities 630 may be voids in the patterned layer 610, 620 in which no material is present. The support structures 635 may separate each of the cavities 630. A metallized polymer top layer 605 and a metallized polymer bottom layer 625 are fabricated at step 2210, and a non-metallized central layer 615 is fabricated at step 2215. The layers are arranged at step 2220 in the order: metallized top layer 605, first patterned layer 610, central layer 615, second patterned layer 620, and metallized bottom layer 625. The layers are then coupled at step 2225 using a carbon dioxide bonding process. The carbon dioxide bonding process may dissolve carbon dioxide into the polymer layers. In various embodiments, the polymer layers may be essentially saturated with carbon dioxide. At step 2230, the bonded layers of the assembly are charged by subjecting the assembly to an energy source. The energy source may, for example, be a corona discharge or electric current or field, or may be any process known in the art to impose an electric charge within the assembly.

Various embodiments may also be used to harvest energy from vibrational sources, such as wind, mechanical vibration, and body movement. In at least one embodiment, the body movement may be walking or running and the sensor is embedded within a shoe. Further embodiments may be used for touch input devices for haptic feedback.

Example 1

Materials

50 µm thick and 100 µm thick COC film (Topas 6017, Topas Company) were used as base polymers for the manufactured compounds. The glass transition temperature of this polymer is 180° C.

Fabrication of COC Ferroelectrets Film

The main steps of the fabrication process are depicted in FIG. 5. The grid with rectangle array was created using a $CO_2$ laser (VersaLASER, Universal Laser Systems). Each rectangle has a dimension of 3 mm×31 mm and the spacing between two adjacent rectangles is 1 mm.

Five layers of COC films (35 mm×35 mm) or grids were arranged in sequence as shown in FIG. 5. Note that the top and bottom COC films with a 100 nm thick aluminum electrodes on one side. Then, the whole assembly was placed in a pressure vessel. After saturation with $CO_2$ at 120° C. and 10 Mpa for 12 h, the pressure was slowly released. Note that the bonding temperature used was 60° C. lower than the glass transition temperature of COC. This benefited from the $CO_2$ enhanced chain mobility at the polymer surface because the addition of $CO_2$ increased the free volume among the polymer segments, thus leading to larger $T_g$ depression. (Yang, 2004). At last, the bonded COC samples were direct-contact charged at room temperature. The applied voltages range from 3 kV to 7 kV. The charging time was typically 10 s.

Piezoelectric Measurements

The piezoelectric $d_{33}$ coefficients were determined by means of static method. A mechanical load from 100 g to 1,300 g was applied to the samples. In order to investigate the short-term thermal stability, the samples were annealed in an oven for one hour at temperatures between 50° C. to 140° C. Their $d_{33}$ were determined after cooling to room temperature. The isothermal decay of the $d_{33}$ coefficient was investigated to determine the long-term thermal stability of the piezoelectrets. Samples were heat-treated at 110° C. for a specific amount of time and then the samples were cooled down to room temperature to measured $d_{33}$ coefficient.

Microstructures

Scanning electron microscope (SEM) images were recorded with a JEOL scanning electron microscope. The samples were fractured in liquid nitrogen. The cross section was sputter-coated with gold before the SEM investigation.

Results and Discussion

FIG. 16 shows $d_{33}$ as a function of the static stress for COC ferroelectrets. The piezoelectric $d_{33}$ coefficient shows a dramatic improvement up to 400 pC/N~1,500 pC/N, which is comparable with the best value of PP ferroelectrets. The basic mechanism in the COC ferroelectrets is to allow the multilayer structure to bend. The bending stiffness for mono-layer film is proportional to the tensile modulus multiplied by the cube of the thickness. Thus the prepared COC ferroelects will have very low tensile modulus. As a comparison, the three-layer COC ferroelectrets were prepared. However, no piezoelectric activity was found because the tensile modulus of the three-layer sandwich structure is approximately proportional with the porosity of the grid.

The piezoelectric activity of COC ferroelectrets show a dependence on the static pressure from 2 kPa to 25 kPa. The $d_{33}$ coefficient decreases significantly with increasing stress. This result is directly due to the sensitivity of the film structure to the applied stress. The applied static stress compresses the layer structure and therefore increases the sample's elastic modulus, which result in a reduced $d_{33}$.

Example 2

Materials

High-temperature grade COC film (Topas 6017, thickness 50 and 100 µm) was purchased from Topas Advanced Polymers. The polymer has a glass transition temperature of 180° C.

Fabrication of COC Ferroelectrets Film

The COC ferroelectrets consisted of five layers of COC films. The top and bottom layers were COC films with 100 nm-thick aluminum electrodes on one side. Two of the five layers were patterned with rectangle channel arrays generated by machining of the 100 µm-thick COC film using a $CO_2$ laser (VersaLASER, Universal Laser Systems). The two patterned COC films had the same dimensions, that is, the same length and width of the rectangles and the same spacing between the rectangular cavities. However, the two patterns were offset by the width of half of the total width of the cavity and spacing (see FIGS. 3, 5 and 7).

The five layers (35 mm×35 mm) were then stacked in sequence (plain-patterned-plain-patterned-plain) and placed between two stainless-steel plates. The whole assembly was subsequently placed in a pressure reactor (CL-1, High Pressure Equipment Company) and a contact pressure was applied by a weight on the assembly. Carbon dioxide was injected by a high-pressure ISCO syringe pump (500 HP, Teledyne Technologies, Inc.) that also was used to maintain constant system pressure. The system was maintained at 120° C. and 10 MPa $CO_2$ pressure for 12 h. after which the pressure was released and bonded assembly removed from the reactor. The bonded COC samples were charged at room temperature by the direct-contact charging method in air via a precision high-voltage power supply (PNC 10000-6ump, Heinzinger Electronic Gmnh). The applied voltage was 5 kV and the charging time was 10 s. The charged samples were stored between aluminum foil for at least 8 h to allow for completion of fast relaxation processes.

Results and Discussion

The bonding strength was measured by lap-shear measurements using a video extensometer system (Shimadzu DV-201) machine in a strain rate of 0.5 mm s$^{-1}$, in accordance with ASTM 3163(01). The specimen dimension was 0.55 mm thick, 12.7 mm wide, and 50 mm long. The overlapped area was 6.4 mm×12.7 mm. The piezoelectric $d_{33}$ coefficients were determined by means of static method using Keithley electrometer (6517A, Keithley Instruments, Inc.), from the well-known equation: $d_{33}=Q/F$. Care was taken to remove potential artifacts that may be caused by the possible air gap by a preloading of 1 N on the sample surface (contact area) before the measurements. [52] A calibrated force F was first loaded on the sample for sufficient time, and then it was removed. The induced charge, Q, was measured and integrated over 10 s. Values averaged from five separate measurements were used for calculation. To investigate the short-term thermal stability, samples were annealed in an oven for 1 h at temperatures between 40 and 160° C. The $d_{33}$ values of the samples were determined after cooling to room temperature. The isothermal decay of the $d_{33}$ coefficient was investigated to determine the long-term thermal stability of the ferroelectrets. Samples were heat-treated at 110° C. for a specific amount of time, and then the samples were cooled to room temperature to measure the $d_{33}$ coefficient.

Microstructures

Scanning electron microscopy (SEM) images were recorded with a JEOL scanning electron microscope (JEOL 7401F). Samples were fractured in liquid nitrogen and the fracture surface was sputter-coated with a thin layer of gold before observation.

Finite Element Simulation

A commercial finite element modeling (FEM) package, COMSOL (version 4.3), was used to simulate the deformation (deflection) of the ferroelectrets under a series of loads. The model's geometry parameters were the same as those in the static piezoelectric measurement setup. A linear elastic stress-strain assumption was made in the simulation.

In summary, a technique was developed for fabrication of COC ferroelectrets by coupling laser cutting and $CO_2$ bonding methods. Very low bonding temperature (120° C.) can be accomplished using $CO_2$ bonding type system. Using novel multilayer structure, it is possible to engineer novel COC ferroelectrets which show significantly enhanced piezoelectric activity in comparison to common cellular structures. This method has a wide potential for continuous industrial fabrication of COC ferroelectrets. Further research is planned optimize, better understand control to generate optimal COC ferroelectrets structures.

Glossary of Claim Terms

Carbon dioxide bonding: A process in which two or more layers of a polymer material may be coupled together by subjecting the layers to elevated heat and pressure in the presence of carbon dioxide.

Cavity or cavities: Voids formed in a polymer sheet by removing a portion of the polymer material. The polymer material may be removed using laser machining techniques.

Ferroelectret: thin films of polymer material, exhibiting piezoelectric and pyroelectric properties after electric charging such that mechanical stresses may be converted into proportionate electric energy.

Horizontal offset or horizontally offset: A multilayer polymer ferroelectret may comprise at least two patterned polymer layers, each of which may comprising a plurality of cavities. The two patterned layers may be offset from one another in the horizontal direction (i.e., the direction perpendicular to the thickness direction of the ferroelectret which is the direction in which the layers are stacked) by a certain distance so that the cavities of a first patterned polymer layer do not line up with the cavities of a second patterned polymer layer in the thickness direction, but rather partially overlap one another. This distance is the horizontal offset.

Metallized polymer: A polymer film with a metal electrode coupled to one side of the film.

Patterned polymer layers: A polymer film that has had a portion of the polymer material removed, such as by laser machining, to form cavities or voids in the polymer film. The cavities may be arranged in a regular or random pattern.

Piezoelectric coefficient ($d_{33}$): ratio of the strain applied in the z-axis (thickness direction of the ferroelectret) to the electric field produced along the same axis.

Polymer foam: A polymer material consisting of at least two phases: a solid polymer matrix and a gaseous phase dispersed within the polymer matrix.

Supporting structures: A portion of the patterned polymer layer remaining after polymer material is removed to form cavities. The supporting structures form the boundaries (sides) of the cavities.

REFERENCES

[1] Bauer, S.; Gerhard-Multhaupt, R.; Sessler, G. M.: Ferroelectrets: Soft Electroactive Foams for Transducers. Physics Today 2004, 57, 37-43.

[2] Gerhard-Multhaupt, R.: Less can be more. Holes in polymers lead to a new paradigm of piezoelectric materials for electret transducers. Dielectrics and Electrical Insulation, IEEE Transactions on 2002, 9, 850-859.

[3] Bauer, S.: Piezo-, pyro- and ferroelectrets: soft transducer materials for electromechanical energy conversion. Dielectrics and Electrical Insulation, IEEE Transactions on 2006, 13, 953-962.

[4] Sessler, G. M.; Hillenbrand, J.: Electromechanical response of cellular electret films. Applied Physics Letters 1999, 75, 3405-3407.

[5] Paajanen, M.; Lekkala, J.; Kirjavainen, K.: ElectroMechanical Film (EMFi)—a new multipurpose electret material. Sensors and Actuators A: Physical 2000, 84, 95-102.

[6] Hillenbrand, J.; Sessler, G. M.: Piezoelectricity in cellular electret films. Dielectrics and Electrical Insulation, IEEE Transactions on 2000, 7, 537-542.

[7] Lindner, M.; Hoislbauer, H.; Schwodiauer, R.; Bauer-Gogonea, S.; Bauer, S.: Charged cellular polymers with "ferroelectric" behavior. Dielectrics and Electrical Insulation, IEEE Transactions on 2004, 11, 255-263.

[8] Kirjavainen, K.: Electromechanical film and procedure for manufacturing same. USPTO, Ed., 1987.

[9] Savolainen, A.; Kirjavainen, K.: Electrothermomechanical film. Part I. Design and characteristics. Journal of Macromolecular Science, Chemistry 1989, A26, 583-91.

[10] Backman, J.: Audio applications of electromechanical film (ETMF). Journal of the Audio Engineering Society 1990, 38, 364-371.

[11] Emfit.

[12] Raisanen, L.; Pohjanvirta, R.; Unkila, M.; Tuomisto, J.: A new method for the measurement of spontaneous motor activity of laboratory animals. Pharmacology and Toxicology 1992, 70, 230-231.

[13] Heikkinen, L. M.; Panula, H. E.; Lyyra, T.; Olkkonen, H.; Kiviranta, I.; Nevalainen, T.; Helminen, H. J.: Electromechanical film sensor device for dynamic force recording from caninen limbs. Scandinavian Journal of Laboratory Animal Science 1997, 24, 85-92.

[14] Screentech.

[15] Hamalainen, M. K.; Parviainen, J. K.; Jaaskelainen, T.: A novel micromovement actuator manufactured using plastic electromechanical film. Review of Scientific Instruments 1996, 67, 1598-1601.

[16] Siivola, J.; Leinonen, K.; Räisänen, L.: ETMF-polymer transducer as a detector of respiration in humans. Medical and Biological Engineering and Computing 1993, 31, 634-635.

[17] Wegener, M.; Bauer, S.: Microstorms in Cellular Polymers: A Route to Soft Piezoelectric Transducer Materials with Engineered Macroscopic Dipoles. ChemPhysChem 2005, 6, 1014-1025.

[18] Streicher, A.; Muller, R.; Peremans, H.; Katenbacher, M.; Lerch, R.: Ferroelectrets: ultrasonic transducer for a biomimetic sonar system. In Ultrasonics Symposium, 2004 IEEE, 2004; Vol. 2; pp 1142-1145 Vol. 2.

[19] Wegener, M.; Wirges, W.: Optimized electromechanical properties and applications of cellular polypropylene—a new space-charge electret material. In The Nano-Micro Interface: Bridging the Micro and Nano Worlds; Fecht, H.-J., Matthias, W., Eds.; Wiley-VCH Verlag GmbH & Co. KGaA; pp 303-317.

[20] Graz, I.; Kaltenbrunner, M.; Keplinger, C.; Schwodiauer, R.; Bauer, S.; Lacour, S. P.; Wagner, S.: Flexible ferroelectret field-effect transistor for large-area sensor skins and microphones. Applied Physics Letters 2006, 89, 073501-3.

[21] Buchberger, G.; Schwodiauer, R.; Bauer, S.: Flexible large area ferroelectret sensors for location sensitive touchpads. Applied Physics Letters 2008, 92, 123511-3.

[22] Savolainen, A.: Biaxially oriented polypropylene blown films. I: Morphological analysis of orientation in the machine direction. Polymer Engineering & Science 1990, 30, 1258-1264.

[23] Wegener, M.; Wirges, W.; Dietrich, J. P.; Gerhard-Multhaupt, R.: Polyethylene terephthalate (PETP) foams as ferroelectrets. In Electrets, 2005. ISE-12. 2005 12th International Symposium on, 2005; pp 28-30.

[24] Wegener, M.; Wirges, W.; Gerhard-Multhaupt, R.: Piezoelectric Polyethylene Terephthalate (PETP) Foams—Specifically Designed and Prepared Ferroelectret Films. Advanced Engineering Materials 2005, 7, 1128-1131.

[25] Wirges, W.; Wegener, M.; Voronina, O.; Zirkel, L.; Gerhard-Multhaupt, R.: Optimized Preparation of Elastically Soft, Highly Piezoelectric, Cellular Ferroelectrets from Nonvoided Poly(ethylene Terephthalate) Films. Advanced Functional Materials 2007, 17, 324-329.

[26] Fang, P.; Wegener, M.; Wirges, W.; Gerhard, R.; Zirkel, L.: Cellular polyethylene-naphthalate ferroelectrets: Foaming in supercritical carbon dioxide, structural and electrical preparation, and resulting piezoelectricity. Applied Physics Letters 2007, 90, 192908-3.

[27] Fang, P.; Wirges, W.; Wegener, M.; Zirkel, L.; Gerhard, R.: Cellular polyethylene-naphthalate films for ferroelectret applications: foaming, inflation and stretching, assessment of electromechanically relevant structural features. e-Polymers 2008.

[28] Behrendt, N.; Greiner, C.; Fischer, F.; Frese, T.; Altstädt, V.; Schmidt, H. W.; Giesa, R.; Hillenbrand, J.; Sessler, G. M.: Morphology and electret behaviour of microcellular high glass temperature films. Applied Physics A: Materials Science & Processing 2006, 85, 87-93.

[29] Paajanen, M.; Wegener, M.; Gerhard-Multhaupt, R.: Understanding the role of the gas in the voids during corona charging of cellular electret films—a way to enhance their piezoelectricity. Journal of Physics D: Applied Physics 2001, 34, 2482-2488.

[30] Lindner, M.; Bauer-Gogonea, S.; Bauer, S.; Paajanen, M.; Raukola, J.: Dielectric barrier microdischarges: Mechanism for the charging of cellular piezoelectric polymers. Journal of Applied Physics 2002, 91, 5283-5287.

[31] Huang, J.; Zhang, X.; Xia, Z. Wang, X.: Piezoelectrets from laminated sandwiches of porous polytetrafluoroethylene films and nonporous fluoroethylenepropylene films. Journal of Applied Physics 2008, 103, 084111-6.

[32] Tuncer, E.; Wegener, M.: Elastic properties of highly anisotropic thin poly(propylene) foams. Materials Letters 2004, 58, 2815-2818.

[33] Tuncer, E.: Numerical calculations of effective elastic properties of two cellular structures. Journal of Physics D: Applied Physics 2005, 38, 497-503.

[34] Gibson, L. J.; Ashby, M.: Cellular solids: structure and properties; 2nd ed.; Cambridge University Press: New York, 1997.

[35] Hillenbrand, J.; Zhang, X.; Zhang, Y.; Sessler, G. M.: Pressure-treated cellular polypropylene with large piezoelectric coefficients. Annual Report—Conference on Electrical Insulation and Dielectric Phenomena 2003, 40-43.

[36] Mellinger, A.; Gonzalez, F. C.; Gerhard-Multhaupt, R.: Ultraviolet-induced discharge currents and reduction of the piezoelectric coefficient in cellular polypropylene films. Applied Physics Letters 2003, 82, 254-256.

[37] An, Z.; Zhao, M.; Yao, J.; Zhang, Y.; Xia, Z.: Improved piezoelectric properties of cellular polypropylene ferroelectrets by chemical modification. Applied Physics A: Materials Science & Processing 2009, 95, 801-806.

[38] Savijarvi, A. M.; Paajanen, M.; Saarimaki, E.; Minkkinen, H.: Novel heat durable electromechanical films: cellular film making from cyclic olefin polymers. In Electrets, 2005. ISE-12. 2005 12th International Symposium on, 2005; pp 75-78.

[39] Saarimaki, E.; Paajanen, M.; Savijarvi, A. M.; Minkkinen, H.; Wegener, M.; Voronina, O.; Schulze, R.; Wirges, W.; Gerhard-Multhaupt, R.: Novel heat durable electromechanical film: processing for electromechanical and electret applications. Dielectrics and Electrical Insulation, IEEE Transactions on 2006, 13, 963-972.

[40] Montanari, G. C.; Fabiani, D.; Ciani, F.; Motori, A.; Paajanen, M.; Gerhard-Multhaupt, R.; Wegener, M.: Charging properties and time-temperature stability of innovative polymeric cellular ferroelectrets. Dielectrics and Electrical Insulation, IEEE Transactions on 2007, 14, 238-248.

[41] Bamji, S. S.; Kao, K. J.; Perlman, M. M.: Polymer electrets corona charged at high temperature. J. Electrost. 1979, 6, 373-9.

[42] Electrets; 2nd ed.; Sessler, G. M., Ed., Springer-Verlag: New York, 1987, pp 453.

[43] Bauer-Gogonea, S.; Bauer, S.: Polymer electrets for electronics, sensors, and photonics. In Light-Emitting Diodes, Lithium Batteries, and Polymer Devices; Nalwa, H. S., Ed.; Academic Press: San DIego, 2001; pp 185-231.

[44] Drobny, J. G.: Technology of Fluoropolymers; 2nd ed.; CRC Press: Boca Raton, 2009.

[45] Xia, Z.; Gerhard-Multhaupt, R.; Kunstler, W.; Wedel, A.; Danz, R.: High surface-charge stability of porous

[46] Künstler, W.; Xia, Z.; Weinhold, T.; Pucher, A.; Gerhard-Multhaupt, R.: Piezoelectricity of porous polytetrafluoroethylene single- and multiple-film electrets containing high charge densities of both polarities. Applied Physics A: Materials Science & Processing 2000, 70, 5-8.

[47] Neugschwandtner, G. S.; Schwödiauer, R.; Bauer-Gogonea, S.; Bauer, S.: Large piezoelectric effects in charged, heterogeneous fluoropolymer electrets. Applied Physics A: Materials Science & Processing 2000, 70, 1-4.

[48] Gerhard-Multhaupt, R.; Zhengfu, X.; Kunstler, W.; Pucher, A.: Preliminary study of multi-layer space-charge electrets with piezoelectric properties from porous and nonporous Teflon films. In Electrets, 1999. ISE 10. Proceedings. 10th International Symposium on, 1999; pp 273-276.

[49] Gerhard-Multhaupt, R.; Kunstler, W.; Gome, T.; Pucher, A.; Weinhold, T.; Seiss, M.; Zhongfu, X.; Wedel, A.; Danz, R.: Porous PTFE space-charge electrets for piezoelectric applications. Dielectrics and Electrical Insulation, IEEE Transactions on 2000, 7, 480-488.

[50] Hillenbrand, J.; Xia, Z.; Zhang, X.; Sessler, G. M.: Piezoelectricity of cellular and porous polymer electrets. In Electrets, 2002. ISE 11. Proceedings. 11th International Symposium on, 2002; pp 46-49.

[51] Hu, Z.; von Seggern, H.: Breakdown-induced polarization buildup in porous fluoropolymer sandwiches: a thermally stable piezoelectret. Journal of Applied Physics 2006, 99, 024102-5.

[52] Zhukov, S.; von Seggern, H.: Polarization hysteresis and piezoelectricity in open-porous fluoropolymer sandwiches. Journal of Applied Physics 2007, 102, 044109-6.

[53] Altafim, R. A. C.; Basso, H. C.; Altafim, R. A. P.; Lima, L.; de Aquino, C. V.; Neto, L. G.; Gerhard-Multhaupt, R.: Piezoelectrets from thermo-formed bubble structures of fluoropolymer-electret films. Dielectrics and Electrical Insulation, IEEE Transactions on 2006, 13, 979-985.

[54] Zhang, X.; Hillenbrand, J.; Sessler, G. M.: Thermally stable fluorocarbon ferroelectrets with high piezoelectric coefficient. Applied Physics A: Materials Science & Processing 2006, 84, 139-142.

[55] Zhang, X.; Hillenbrand, J.; Sessler, G. M.: Ferroelectrets with improved thermal stability made from fused fluorocarbon layers. Journal of Applied Physics 2007, 101, 054114-8.

[56] Zhang, X.; Huang, J.; Xia, Z.: Piezoelectric activity and thermal stability of cellular fluorocarbon films. Physica Scripta 2007, 274.

[57] Mellinger, A.; Wegener, M.; Wirges, W.; Gerhard-Multhaupt, R.: Thermally stable dynamic piezoelectricity in sandwich films of porous and nonporous amorphous fluoropolymer. Applied Physics Letters 2001, 79, 1852-1854.

[58] Voronina, O.; Wegener, M.; Wirges, W.; Gerhard, R.; Zirkel, L.; Münstedt, H.: Physical foaming of fluorinated ethylene-propylene (FEP) copolymers in supercritical carbon dioxide: single-film fluoropolymer piezoelectrets. Applied Physics A: Materials Science & Processing 2008, 90, 615-618.

[59] Evreinov, G.; Raisamo, R.: One-directional position-sensitive force transducer based on EMFi. Sensors and Actuators A: Physical 2005, 123-124, 204-209.

[60] Qiu X, Patterned piezo-, pyro-, and ferroelectricity of poled polymer electrets. Journal of Applied physics 2010, 108, 011101-19.

[61] S. A. Wilson, R. P. J. Jourdain, Q. Zhang, R. A. Dorey, C. R. Bowen, M. Willander, Q. U. Wahab, M. Willander, M. A. H. Safaa, O. Nur, E. Quandt, C. Johansson, E. Pagounis, M. Kohl, J. Matovic, B. Samel, W. van der Wijngaart, E. W. H. Jager, D. Carlsson, Z. Djinovic, M. Wegener, C. Moldovan, R. Iosub, E. Abad, M. Wendlandt, C. Rusu, K. Persson, New materials for micro-scale sensors and actuators an engineering review. Mater. Sci. Eng. R2007, 56, 1.

[62] Wirges W, Wegener M, Voronina O, Zirkel L, Gerhard-Multhaupt R, Optimized preparation of elastically soft, highly piezoelectric cellular ferroelectrets from non-voided poly(ethylene terephthalate) films. Advanced Functional Materials 2007, 17, 324-329.

[63] Wegener M, Wirges W, Gerhard-Multhaupt R, Piezoelectric polyethylene terephthalate (PETP) foams-specifically designed and prepared ferroelectret films. Advanced Engineering Materials 2005, 7, 1128-1131.

[64] Tuncer E, Wegener M, Elastic properties of highly anisotropic thin poly(propylene) foams. Materials Letters 2004, 58, 2815-2818.

[65] Yang G M, Sessler G M, Hatke W, Electret properties of cycloolefin-copolymer-polypropylene blends. IEEE Internat. Symp. Electret, Delphi, Greece, PP. 317-320, 1999.

[66] Sessler G M, Yang G M, Hatke W, in 1997 Annual Report, Conference on Electrical Insulation and Dielectric Phenomena, IEEE 1997, 467-470.

[67] Wegener M, Paajanen M, Voronina O, Schulze R, Wirges W, Gerhard-Multhaupt, Voided cyclo-olefin polymer films: ferroelectrets with high thermal stability. in: Proceedings 12th International Symposium on Electrets (ISE 12), IEEE Service Center, Piscataway, N.J., (2005), p. 47-50.

[68] Savijärvi A-M, Paajanen M, Saarimäki E, Minkkinen H, Novel heat durable electromechanical films: cellular film making from cyclic olefin polymers. in: Proceedings 12th International Symposium on Electrets (ISE 12), IEEE Service Center, Piscataway, N.J., (2005), p. 75-78.

[69] Saarimäki E, paajanen M, Savijärvi Ann-Mari, Minkkinen H, Wegener M, Voronina O, Schulze R, Wirges W, Gerhard-Multhaupt R, Novel heat durable electromechanical film: processing for electromechanical and electrets applications. IEEE Transactions on Dielectrics and Electrical Insulation 2006, 13, 963-972.

[70] Saarimäki E, Paajanen M, Savijärvi A-M, Minkkinen H, Novel heat durable electromechanical film processing: Preparations for electromechanical and electret applications", in: IEEE 12th Intern. Sympos. Electrets (ISE 12), p. 220-223 2005.

[71] X. Qiu, L. Hollander, R. F. Suárez, W. Wirges, R. Gerhard, Appl. Phys. Lett. 2010, 97, 072905.

[72] N. Behrendt, IEEE Trans. Dielectr. Electr. Insul. 2010, 17, 1113.

[73] Z. Sun, X. Zhang, Z. Xia, X. Qiu, W. Wirges, R. Gerhard, C. Zeng, C. Zhang, B. Wang, Appl. Phys. A 2011, 105, 197.

[74] G. Cao, X. Zhang, D. Zhao, C. Zhang, B. Wang, C. Zeng, IEEE Trans. Dielectr. Electr. Insul. 2012, 19, 1108.

[75] D. R. Falconi, R. A. C. Altafim, R. A. P. Altafim, H. C. Basso, in 2011 Annual Report, CEIDP, IEEE 2011, p. 137.

[76] R. A. P. Altafim, X. Qiu, W. Wirges, R. Gerhard, R. A. C. Altafim, H. C. Basso, W. Jenninger, J. Wagner, J. Appl. Phys. 2009, 106, 014106.

[77] R. A. P. Altafim, X. Qiu, W. Wirges, R. A. C. Altafim, H. C. Basso, R. Gerhard, D. L. Chinaglia, W. Jenninger, J. Wagner, in 2010 Annual Report, CEIDP, IEEE 2010, p. 1.
[78] R. A. P. Altafim, R. A. C. Altafim, H. C. Basso, X. Qiu, W. Wirges, R. Gerhard, in 2011 Annual Report, CEIDP, IEEE 2011, p. 133.
[79] R. A. P. Altafim, D. Rychkov, W. Wirges, R. Gerhard, H. C. Basso, R. A. C. Altafim, IEEE Trans. Dielectr. Electr. Insul. 2012, 19, 1116.
[80] X. Zhang, J. Huang, J. Chen, Z. Wan, S. Wang, Z. Xia, Appl. Phys. Lett. 2007, 91, 182901.
[81] X. Zhang, G. Cao, Z. Sun, Z. Xia, J. Appl. Phys. 2010, 108, 064113.
[82] Z. Chen, C. Zeng, C. Zhang, B. Wang, K. Cao, Z. Yao, J. Appl. Polym. Sci. 2012, 126, 1121.
[83] M. Liu, H. Lin, M. Yang, M. Lai, C. Chang, M. Feng, P. Shiao, I. Chen, Polym. Degrad. Stab. 2006, 91, 1443.
[84] T. Yang, S. Lin, T. Chuang, Polym. Degrad. Stab. 2002, 78, 525.
[85] D. B. Kline, R. P. Wool, Polym. Eng. Sci. 1988, 28, 52.
[86] I. Sanchez, R. Lacombe, J. Phys. Chem. 1976, 80, 2352.
[87] I. Sanchez, R. Lacombe, Macromolecules 1978, 11, 1145.
[88] P. Condo, I. Sanchez, C. Panayiotou, K. Johnston, Macromolecules 1992, 25, 6119.
[89] R. A. L. Jones, Nat. Mater. 2003, 2, 645.
[90] Y. Yang, C. Zeng, L. J. Lee, Adv. Mater. 2004, 16, 560.
[91] Y. Yang, D. Liu, Y. Xie, L. J. Lee, D. L. Tomasko, Adv. Mater. 2007, 19, 251.
[92] Y. Yang, Y. Xie, X. Kang, L. J. Lee, D. A. Kniss, J. Am. Chem. Soc. 2006, 128, 14040.
[93] G. M. Sessler, J. Hillenbrand, Appl. Phys. Lett. 1999, 75, 3405.
[94] S. P. Timoshenko, S. Woinowsky-Krieger, Theory of Plates and Shells, McGraw-Hill, New York 1959.
[95] K. Bhaskar, B. Kaushik, Compos. Struct. 2005, 68, 303.
[96] J. Neggers, J. P. M. Hoefnagels, M. G. D. Geers, J. Mater. Res. 2012, 27, 1245.
[97] Topas COC product overview (2006), http://www.topas.com/products/topas-coc-polymers, accessed: August 2013.
[98] A. Mellinger, M. Wegener, W. Wirges, R. R. Mallepally, R. Gerhard-Multhaupt, Ferroelectrics 2006, 331, 189.
[99] D. Rychkov, R. A. P. Altafim, X. Qiu, R. Gerhard, J. Appl. Phys. 2012, 111, 124105.
[100] P. S. Nunes, P. D. Ohlsson, O. Ordeig, J. P. Kutter, Microfluid. Nanofluid. 2010, 9, 145.

All referenced publications are incorporated herein by reference in their entireties. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing disclosure, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A method for producing a multilayer polymer ferroelectret, comprising:
fabricating a plurality of patterned polymer layers, each patterned polymer layer comprising a plurality of cavities separated by supporting structures;
fabricating a metallized polymer top layer and a metallized polymer bottom layer;
fabricating a non-metallized flexible polymer central layer;
arranging the plurality of patterned layers, the metallized polymer top layer, the metallized polymer bottom layer and the non-metallized flexible polymer central layer such that at least one first patterned polymer layer of the plurality of patterned polymer layers is positioned between the metallized polymer top layer and the non-metallized flexible polymer central layer and at least one second patterned polymer layer of the plurality of patterned polymer layers is positioned between the non-metallized flexible polymer central layer and the metallized polymer bottom layer to form an assembly, and wherein the plurality of cavities of the first patterned polymer layer and the plurality of cavities of the second patterned polymer layer are adjacent to the non-metallized flexible polymer central layer and wherein the plurality of cavities of the first patterned polymer layer are positioned in a horizontal offset from the plurality of cavities of the second patterned polymer layer;
coupling the layers of the assembly using a carbon dioxide bonding process to form a bonded assembly; and
electrically charging the bonded assembly by subjecting the bonded assembly to an energy source.

2. The method of claim 1, wherein the horizontal offset positions each one of the supporting structures of the at least one first patterned polymer layer within a width of a cavity of the plurality of cavities of the second patterned polymer layer.

3. The method of claim 1, wherein at least one of [i] the plurality of patterned polymer layers, [ii] the metallized polymer top layer, [iii] the metallized polymer bottom layer, or [iv] the non-metallized flexible polymer central layer comprises a polymer selected from cyclo-olefin copolymer, cyclic-olefin polymer, polypropylene, polyethylene naphthalene, polyethylene terephthalate, fluorinated ethylene propylene, polytetrafluoroethylene, polyethylene, polyetherimide, or mixtures thereof.

4. The method of claim 1, wherein at least one of [i] the plurality of patterned polymer layers, [ii] the metallized polymer top layer, [iii] the metallized polymer bottom layer, or [iv] the non-metallized flexible polymer central layer comprises a polymer foam.

5. The method of claim 1, wherein the energy source is a corona discharge or contact charge.

6. The method of claim 1, wherein the energy source is an electric field or current.

7. The method of claim 1, wherein the carbon dioxide bonding process dissolves carbon dioxide into at least one of [i] the plurality of patterned polymer layers, [ii] the metallized polymer top layer, [iii] the metallized polymer bottom layer, or [iv] the non-metallized flexible polymer central layer.

8. A method for producing a multilayer polymer ferroelectret, comprising:
fabricating a first patterned polymer layer and a second patterned polymer layer, each of the first patterned polymer layer and the second patterned layer comprising a plurality of cavities separated by support structures;

fabricating a metallized polymer top layer and a metallized polymer bottom layer;

fabricating a non-metallized flexible polymer central layer;

arranging the layers in the order: metallized polymer top layer, first patterned polymer layer, non-metallized flexible polymer central layer, second patterned polymer layer, and metallized polymer bottom layer to form an assembly, and wherein the plurality of cavities of the first patterned polymer layer and the plurality of cavities of the second patterned polymer layer are adjacent to the non-metallized flexible polymer central layer and wherein the plurality of cavities of the first patterned polymer layer are positioned in a horizontal offset from the plurality of cavities of the second patterned polymer layer;

coupling the layers of the assembly using a carbon dioxide bonding process to form a bonded assembly; and electrically charging the bonded assembly by subjecting the bonded assembly to an energy source.

9. The method of claim 8, wherein the horizontal offset positions each one of the supporting structures of the first patterned polymer layer within a width of a cavity of the plurality of cavities of the second patterned polymer layer.

10. The method of claim 8, wherein at least one of [i] the first patterned polymer layer, [ii] the second patterned polymer layer, [iii] the metallized polymer top layer, [iv] the metallized polymer bottom layer, or [v] the non-metallized flexible polymer central layer comprises a polymer selected from cyclo-olefin copolymer, cyclic-olefin polymer, polypropylene, polyethylene naphthalene, polyethylene terephthalate, fluorinated ethylene propylene, polytetrafluoroethylene, polyethylene, polyetherimide, or mixtures thereof.

11. The method of claim 8, wherein at least one of [i] the first patterned polymer layer, [ii] the second patterned polymer layer, [iii] the metallized polymer top layer, [iv] the metallized polymer bottom layer, or [v] the non-metallized flexible polymer central layer comprises a polymer foam.

12. The method of claim 8, wherein the carbon dioxide bonding process dissolves carbon dioxide into at least one of [i] the first patterned polymer layer, [ii] the second patterned polymer layer, [iii] the metallized polymer top layer, [iv] the metallized polymer bottom layer, or [v] the non-metallized flexible polymer central layer.

* * * * *